United States Patent [19]
Hattori

[11] Patent Number: 5,544,269
[45] Date of Patent: Aug. 6, 1996

[54] OPTICAL TRANSMISSION MODULE AND METHOD OF FORMING THE SAME

[75] Inventor: Hitoshi Hattori, Sagamihara, Japan

[73] Assignee: Ricoh Company Ltd., Tokyo, Japan

[21] Appl. No.: 355,559

[22] Filed: Dec. 14, 1994

[51] Int. Cl.$^6$ ............................ G02B 6/00; G02B 6/36
[52] U.S. Cl. ................................................................ 385/88
[58] Field of Search ........................... 385/24, 49, 88–97

[56] References Cited

U.S. PATENT DOCUMENTS

| | | | |
|---|---|---|---|
| 4,079,404 | 3/1978 | Comerford et al. | 385/88 |
| 4,466,696 | 8/1984 | Carney | 385/49 |
| 4,756,591 | 7/1988 | Fischer et al. | 385/88 |
| 4,767,174 | 8/1988 | Carenco et al. | 385/97 |
| 4,900,118 | 2/1990 | Yanagawa et al. | 385/24 |
| 5,243,671 | 9/1993 | Koteles et al | 385/88 |
| 5,414,787 | 5/1995 | Kurata | 385/88 |

FOREIGN PATENT DOCUMENTS

| | | | |
|---|---|---|---|
| 4157405 | 5/1992 | Japan | G02B 6/42 |
| 4361210 | 12/1992 | Japan | G02B 6/42 |

OTHER PUBLICATIONS

English language abstract of Japanese Laid–Open Application No. 4–157405 filed May 29, 1992.

English language abstract of Japanese Laid–Open Application No. 4–361210 filed Dec. 14, 1992.

*Primary Examiner*—Akm E. Ullah
*Attorney, Agent, or Firm*—Cooper & Dunham LLP

[57] ABSTRACT

An optical transmission module having optical fibers and an optical semiconductor device with light couplings between the optical fibers and conversion parts of the optical semiconductor device, which conversion parts either convert electrical signals into optical signals or convert optical signals into electrical signals, includes a guide substrate having grooves which hold the optical fibers, and at least one positioning part formed on and protruding from the optical semiconductor device and having a width smaller than that of the grooves, wherein the optical semiconductor device is attached to the guide substrate such that the at least one positioning part fits into the grooves, so that the conversion parts face end surfaces of the optical fibers to establish the light couplings.

15 Claims, 21 Drawing Sheets

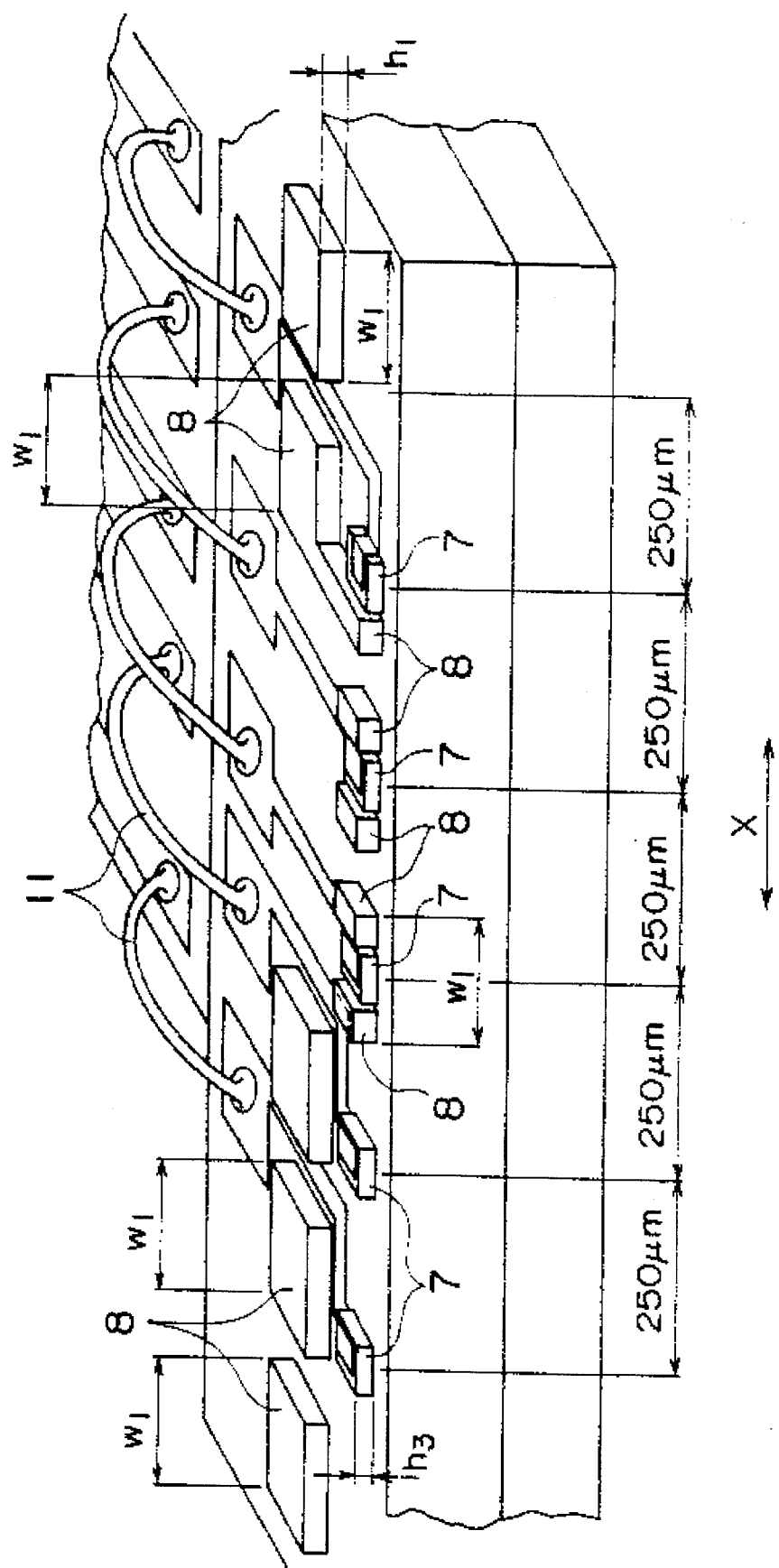

FIG. 8
| ch. | LIGHT COUPLING EFFICIENCY (%) |
|---|---|
| 1 | 4.2 |
| 2 | 4.2 |
| 3 | 4.1 |
| 4 | 4.1 |
| 5 | 4.2 |
| 6 | 4.1 |
| 7 | 4.2 |
| 8 | 4.3 |
~22
FIG. 9A
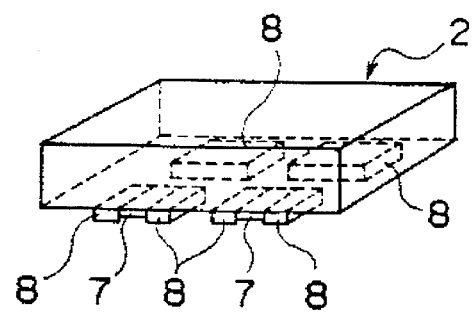
FIG. 9B
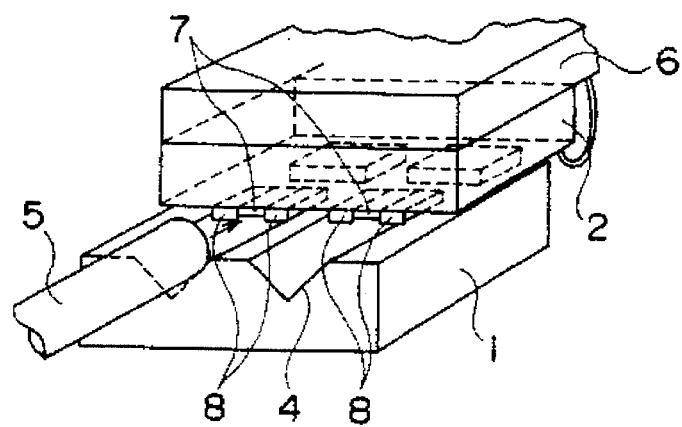

FIG. 23B1 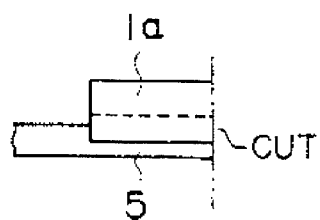
FIG. 23B2 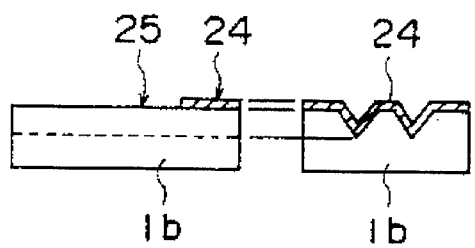

OPTICAL TRANSMISSION MODULE AND METHOD OF FORMING THE SAME

BACKGROUND OF THE INVENTION

1. Field of the Invention

The present invention generally relates to optical transmission modules and methods of forming such modules, and particularly relates to an optical transmission module which is used in such areas as optical communication, an optical LAN (local area network), and an optical interface, and to a method of forming such a module.

2. Description of the Prior Art

Devices such as light emitting/receiving devices used in optical transmission modules of the prior art differ depending on their applications. For example, in light of a future prospect that speed and capacity of information transmission will need to be further increased, there is mounting need for methods of parallel and high-speed transmission of light signals. Among such transmissions, long-distance transmission may require a combination of a semiconductor laser array and single-mode optical fibers. On the other hand, intermediate-to-short-distance transmission may require a combination of a light-emitting diode array and multi-mode optical fibers.

A first reference of the prior art, Japanese Laid-Open Patent Application No.4-361210, discloses a device connecting a light-emitting device array or a light receiving-device array with an optical fiber array and a method of implementing the same. In this first reference, a connecting device includes a first fixture which has a slanted slide surface and holds an optical fiber array, and a second fixture which has a slanted fitting surface which can support the slanted slide surface of the first fixture sliding thereupon and holds a light-emitting device array (or light-receiving device array). By placing and sliding the slanted slide surface on the slanted fitting surface, the light-emitting/receiving device array can be precisely positioned with regard to the optical fiber array.

A second reference of the prior art, Japanese Laid-Open Patent Application No.4-157405, discloses a light device module. In this second reference, light-emitting/receiving devices are connected via solder bumps to a wiring pad of a metal wiring pattern on a board, and optical fibers are fixed into v-shaped grooves formed on the board. In positioning the light-emitting/receiving devices relative to the optical fibers, positioning precision in the longitudinal and lateral directions with regard to the board is ensured by utilizing the self-alignment ability of the melted solder and by controlling the amount of the pasted solder. Also, a highly efficient light coupling is obtained by aligning the field patterns and inserting spherical lenses between the light-emitting/receiving devices and optical fibers. The optical fibers are positioned at a predetermined distance away from the spherical lenses so as to avoid damages caused by a physical contact.

Semiconductor lasers used for light transmission at practical levels as described above have a structure of an edge-emitting type. In order to efficiently lead a light signal transmitted from those lasers into a single-mode optical fiber, which has a core diameter in the order of microns, a highly precise positioning/connecting method must be devised. Also, in addition to the realization of the highly precise positioning and connecting method, light-signal transmission modules are required to be miniaturized and made light-weight. This is because existing facilities for copper wiring cables should also be used for optical fibers for the benefit of cost saving of the investment. Especially, a parallel data transmission in 1-byte units, which is used for a data bus and the like, imminently requires a larger capacity and miniaturization of such modules. The first and second references cited above are devised in order to response to such needs.

In the first reference, however, a guide board becomes necessary for aligning optical fibers. The guide board defines a predetermined array pitch for optical fibers and semiconductors such as a light-emitting device array or a light-receiving device array implemented on a heat sink for releasing heat. Thus, metal stems, mounts, or blocks for a fixing purpose become necessary, putting a limit on an extent to which the device is miniaturized. Also, the cost of the device is difficult to lower because of material costs of such components. Since this type of device has various components in a large number, inordinate efforts are required for the adjustment of each components with regard to x, y, and z axes and rotation axes. This leads to a difficulty in implementing such devices into each part of a module.

In the second reference, spherical lenses (or micro-lenses) are employed in order to efficiently lead light emitted from an light-emitting/receiving device into an optical fiber having a diameter in the order of microns. In this case, bump connections by using melted solder are employed to ensure a sufficient precision in positioning the devices. The solder bumps are created by depositing three metal layers of titanium/tungsten-alloy/copper on wiring pads formed on a light-emitting/receiving device chip, electroplating copper and solder (Pb-Sn, 96:6) on the bi-metal alloy, and reflowing at the end. Thus, there are cases in which connection failures are generated during a thermal cycle by a difference in thermal expansion coefficients between the solder bumps and a substrate, and in which remaining flux created during the reflow causes defects in the light-emitting/receiving device. Those problems add to the lack of reliability of the device. Also, since arrayed light-emitting/receiving devices increase the number of parameters of electrical control, ensuring the reliability becomes more difficult. The array structure adds to a difficulty in positioning the arrayed devices in the longitudinal and lateral directions by using the self-alignment ability of the melted solder and controlling the amount of the solder. Furthermore, using solder bumps puts a limit on cost reduction because of the cost of forming bumps.

Accordingly, there is a need in the field of optical transmission modules for an optical transmission module with a miniaturized size and a larger capacity which is reliable, operates efficiently, and can be produced at a low cost.

Also, there is a need for a method of forming such an optical transmission module.

SUMMARY OF THE INVENTION

Accordingly, it is a general object of the present invention to provide an optical transmission module and a method of forming such a module which can satisfy the needs described above.

It is another and more specific object of the present invention to provide an optical transmission module with a miniaturized size and a larger capacity which is reliable, operates efficiently, and can be produced at a low cost.

In order to satisfy the needs described above, according to the present invention, an optical transmission module having optical fibers and an optical semiconductor device with light couplings between the optical fibers and conversion parts of the optical semiconductor device, which conversion parts either convert electrical signals into optical signals or convert optical signals into electrical signals, includes a guide substrate having grooves which hold the optical fibers, and at least one positioning part formed on and protruding from the optical semiconductor device and having a width smaller than that of the grooves, wherein the optical semiconductor device is attached to the guide substrate such that the at least one positioning part fits into the grooves, so that the conversion parts face end surfaces of the optical fibers to establish the light couplings.

In the optical transmission module according to the present invention, the at least one positioning part having the width smaller than that of the grooves formed on the guide substrate is fit into the grooves when a sub-substrate having the optical semiconductor device is attached to the guide substrate. Thus, the semiconductor devices can be readily and precisely attached, and a highly efficient light coupling can be establish,ed between the optical semiconductor device and the optical fibers with little variation in light output.

It is yet another example of the present invention to provide a method of forming an optical transmission module as described above.

In order to satisfy the above object, a method of forming an optical transmission module having optical fibers and an optical semiconductor device with light couplings between the optical fibers and conversion parts of the optical semiconductor device, which conversion parts either convert electrical signals into optical signals or convert optical signals into electrical signals, includes the steps of fixing the optical fibers in first grooves formed on a first guide substrate, forming a cover layer on a first part of a top surface of a second guide substrate which has second grooves in a mirror-image arrangement of that of the first grooves, sticking the first guide substrate to the second guide substrate such that the optical fibers are placed between the first grooves and the second grooves and such that the first guide substrate lies on a second part of the top surface where the cover layer is not provided, wherein said first guide substrate is positioned by an edge of said cover layer, removing the cover layer from the first part, and attaching the optical semiconductor device to the first part of the top surface, wherein the conversion parts face end surfaces of the optical fibers to establish the light couplings.

According to the present invention, the method of forming the light transmission module attaches the optical fibers on the top surface of the second substrate by using the first guide substrate and the cover layer for positioning the optical fibers, and attaches the optical semiconductor device to part of the top surface where the cover layer has been removed. Thus, a simple process can ensure the alignment and positioning of the optical fibers on the second guide substrate while providing a space for attaching the optical semiconductor device thereupon.

Other objects and further features of the present invention will be apparent from the following detailed description when read in conjunction with the accompanying drawings.

BRIEF DESCRIPTION OF THE DRAWINGS

FIG. 6 is an isometric view of the edge-emitting-type LEDA of a second embodiment according to the present invention;

FIG. 8 shows data of the light-coupling efficiency for each channel of the light transmission module;

FIGS. 9A and 9B are, respectively, an isometric view of an edge-emitting-type LEDA of a third embodiment of the present invention, and an isometric view of the edge-emitting-type LEDA attached to a guide substrate;

FIGS. 23A to 23D are process charts of a method of forming an optical transmission module, according to a ninth embodiment of the present invention;

DESCRIPTION OF THE PREFERRED EMBODIMENTS

In the following, a description of embodiments of the present invention will be described with reference to the accompanying drawings.

A first embodiment of an optical transmission module according to the present invention will be described with reference to FIGS. 1A and 1B to FIG. 5.

Figure 1A:
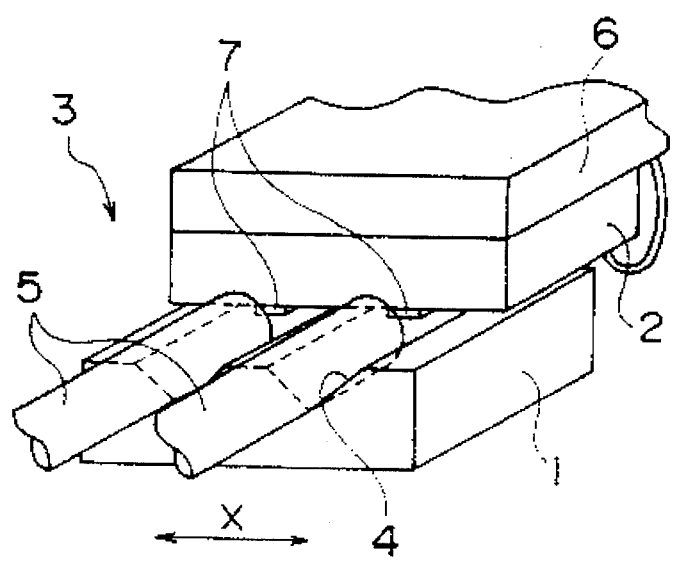
FIGS. 1A and 1B are, respectively, an isometric view of a first embodiment of an optical transmission module according to the present invention, and a cross-sectional view of the first embodiment along a line taken in a direction X of FIG. 1A.

FIG. 1A shows an isometric view of an optical transmission module 3. The optical transmission module 3 includes an optical-fiber-aligning guide substrate 1 (hereinafter called a guide substrate), and a light-emitting-diode array 2 of an edge-emitting type (hereinafter called an edge-emitting-type LEDA) which is implemented upside down on the guide substrate 1. V-shaped grooves 4 are formed on the guide substrate 1 in order to hold optical fibers 5. The optical fibers 5 are arranged at intervals of 250 μm in a direction X and are fixed in the v-shaped grooves 4. (Only two of the optical fibers 5 are shown in FIG. 1A.)

Figure 2:
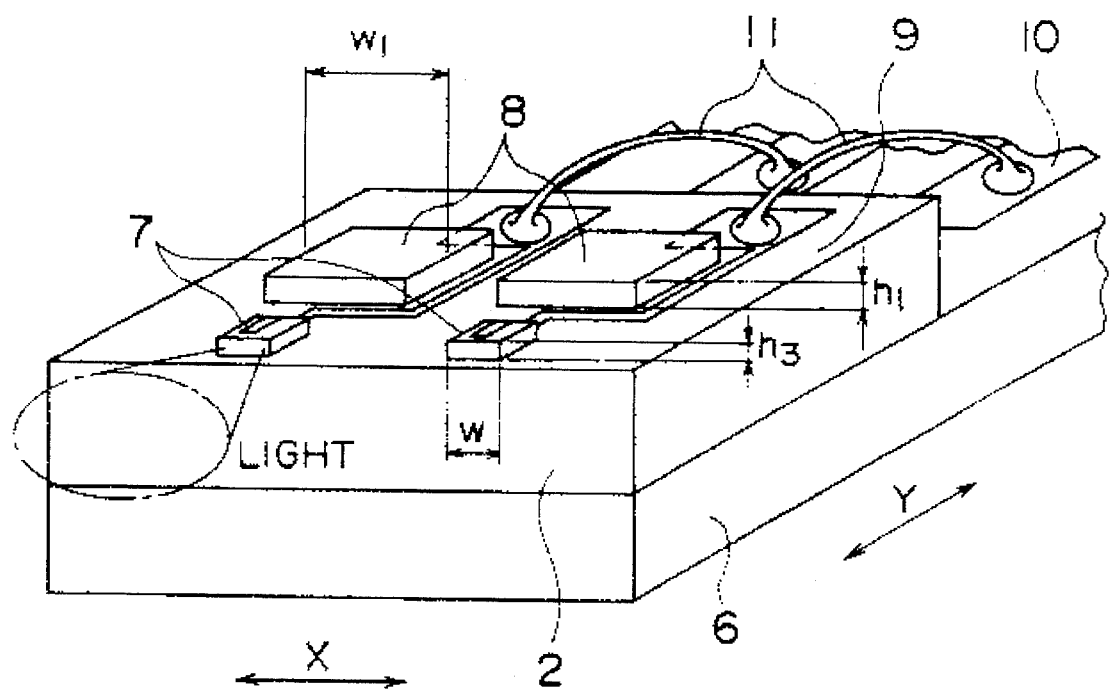
FIG. 2 is an isometric view of an edge-emitting-type LEDA of FIG. 1A.

FIG. 2 is an isometric view of the edge-emitting-type LEDA 2. The edge-emitting-type LEDA 2 is formed on a sub-substrate 6, and has light-emitting parts 7 arranged on an array surface thereof at the intervals of 250 μm in the direction X as are the optical fibers 5. The light-emitting parts 7 have a height $h_3$ of 2 to 3 μm. Positioning parts 8 for a positioning purpose which has a plane shape are arranged behind each of the light-emitting parts 7. The positioning parts 8 are used for positioning the edge-emitting-type LEDA 2 with regard to the guide substrate 1 in the direction X. Behind the positioning parts 8, chip wiring parts 9 coupled to the light-emitting parts 7 are electrically connected with wiring parts 10 on the sub-substrate 6 by wires 11 formed by means of wire bonding. Here, some areas on the edge-emitting-type LEDA 2 face the v-shaped grooves 4 on the guide substrate 1, when the edge-emitting-type LEDA 2 is implemented upside down on the guide substrate 1. Those areas are called a fitting area.

Here, the light-emitting parts 7 of the edge-emitting-type LEDA 2 can serve as light-receiving parts. Namely, the light-emitting parts 7 emit light when an electrical voltage is applied, and generate an electric current proportional to the amount of light illuminated thereupon. For the sake of simplicity, the light-emitting parts 7 are not referred to by other terms such as light receiving parts or light emitting/receiving parts hereinafter. However, it should be noted that the light-emitting parts 7 can serve as light-receiving parts, and, thus, the optical transmission module 3 according to the present invention should be considered as such.

Figure 1B:
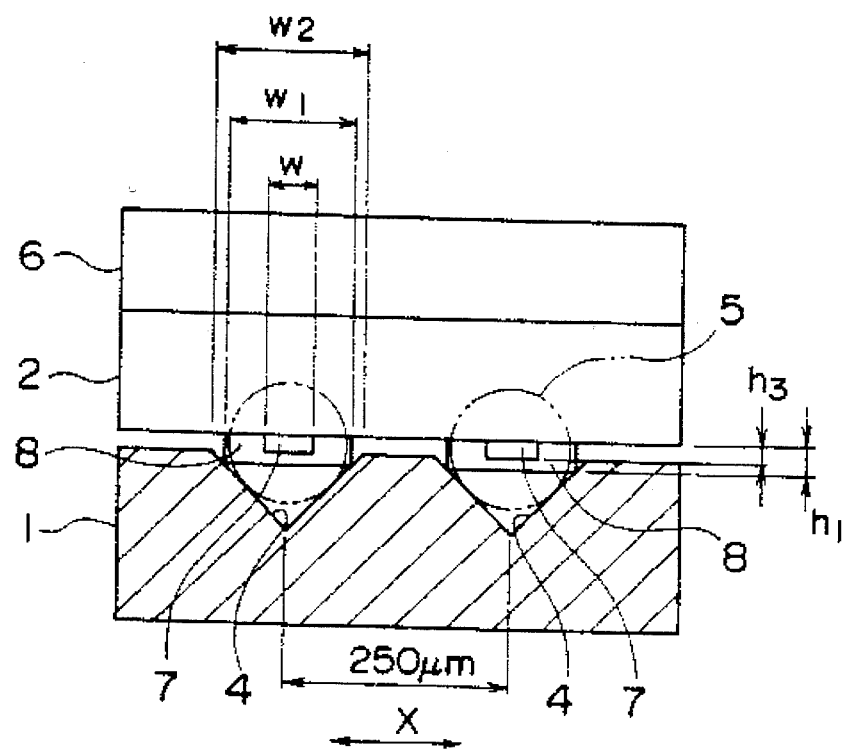
Figure 3:
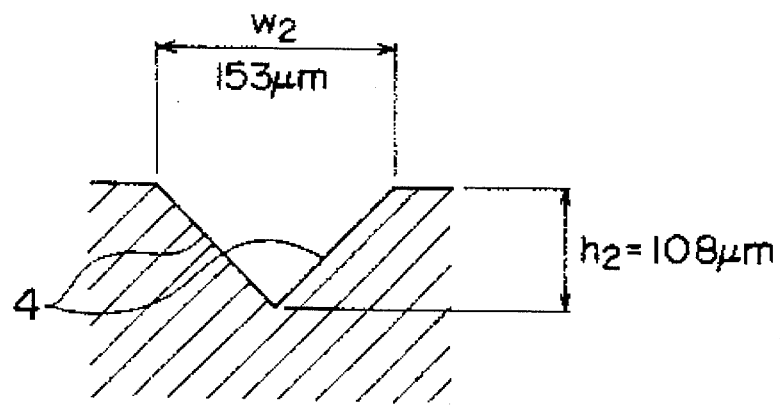
FIG. 3 is a illustrative drawing of grooves of FIG. 1A, showing dimensions of the grooves.

FIG. 1B shows a cross-sectional view of the optical transmission module 3 along a line taken in the direction X. Here, the width $W_1$ in the direction X of the positioning parts 8 formed on the edge-emitting-type LEDA 2 is made smaller than a width $W_2$ of the v-shaped grooves 4 on the guide substrate 1. As an example of dimensions, when the width $W_1$ is 150 μm and a height $h_1$ of the positioning parts 8 is several microns, the width $W_2$ and a height $h_2$ of the v-shaped grooves 4 on the guide substrate 1 may be 153 μm and 108 μm, respectively, as shown in FIG. 3. Also, a width W and a height $h_3$ of the light-emitting parts 7 may be 45 μm and a few microns, respectively. When assembling each component having the dimensions such as the above, the sub-substrate 6 with the edge-emitting-type LEDA 2 is turned upside down without the guide substrate 1 touching the wires 11, and, then, the positioning parts 8 are adhered to the v-shaped grooves 4 of the guide substrate 1. In this manner, the light-emitting parts 7 are positioned relative to the optical fibers 5 with predetermined intervals between the two components, so that light emitted by the light-emitting parts 7 can be efficiently introduced to the optical fibers 5. Here, the positions and sizes of the positioning parts 8 and the v-shaped grooves 4 are adjusted when they are formed, such that the centers of the optical fibers 5 correspond to the centers of the light-emitting parts 7.

Figure 4A:
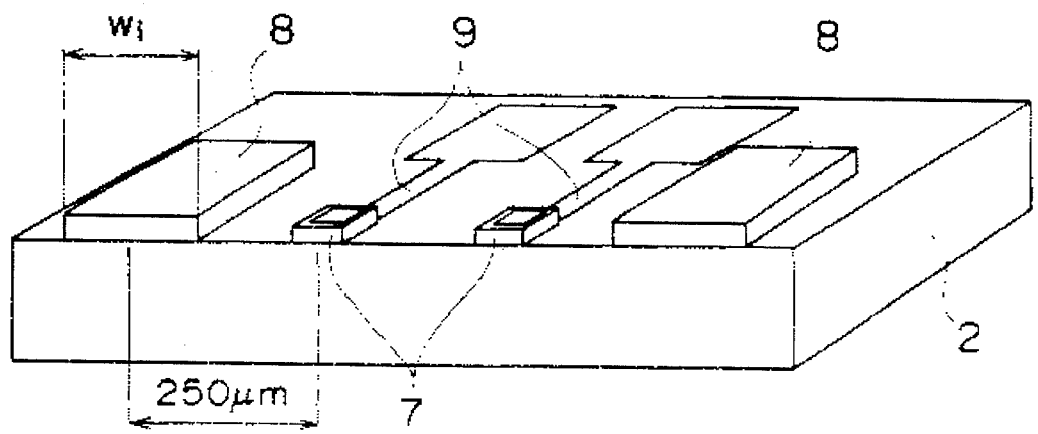
FIGS. 4A, 4B, and 4C are variations of positioning parts formed on the edge-emitting-type LEDA.
Figure 4B:
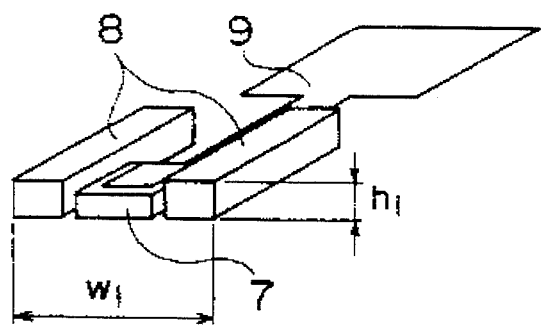
Figure 4C:
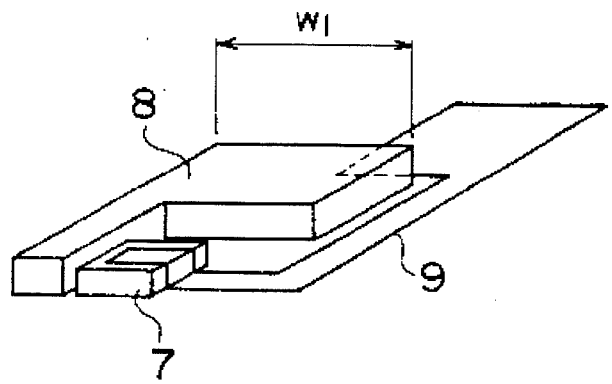

FIGS. 4A to 4C show variations of the positioning parts 8 formed on the edge-emitting-type LEDA 2. FIG. 4A shows an example where the positioning parts 8 are placed at a predetermined distance from the light-emitting parts 7. FIG. 4B shows another example where the positioning parts 8 are placed on both sides of the light-emitting parts 7. FIG. 4C shows yet another example where the positioning parts 8 are placed on one side of and behind the light-emitting parts 7. Such various configurations of the positioning parts 8 can be devised. One variation may be used alone or used with other variations according to the conditions under which the optical transmission module 3 is used. Light emitted from the light-emitting parts 7 does not have such a directivity as does laser light, and is dispersed in various directions. Thus, even if there is a 250-μm interval between adjacent light-emitting parts 7, it is possible that light emitted from one of the light-emitting parts 7 enters the adjacent optical fiber from some reason such as random reflections. In such a case, optical crosstalk caused by the dispersed light may degrade an error rate of the optical transmission. The configurations shown in FIGS. 4B and 4C, where the positioning parts 8 are placed on one side or both sides of the light-emitting parts 7, do not have such a problem of crosstalk, thus ensuring a reliability of optical signal detection.

The v-shaped grooves 4 on the guide substrate 1 are formed by using a thin-layer forming process for semiconductors. When the height of the light-emitting parts 7 are several micrometers more or less, the configuration shown in FIG. 1B works well without producing crosstalk. For example, the guide substrate 1 made of silicon can be formed by means of anisotropic etching of single crystal silicon using a KOH solution. In this case, no problem arises with regard to a precision of pitches during the etching. (When insulation matters, an oxide layer and the like can be formed on the substrate surface.) Also, the guide substrate 1 can be formed with ceramic or glass by using a cutting process, or be formed with a plastic. The positioning parts 8 of the edge-emitting-type LEDA 2 can be formed with a $SiO_2$ layer by using a semiconductor process, which can readily realize the positioning precise enough to match the v-shaped grooves 4 formed on the guide substrate 1. Namely, the edge-emitting-type LEDA 2 is formed as a wafer; a $SiO_2$ layer is formed as a wafer by plasma CVD (chemical vapor deposition); areas to become the positioning part 8 are covered by patterning a photoresist; the $SiO_2$ layer other than the covered areas is removed by etching; and the positioning parts 8 are formed by removing the photoresist. Also, the positioning parts 8 can be created by using a lift-off method on a $SiO_2$ layer formed by a low temperature sputtering or deposition. A semiconductor process which can ensure a precision of the positioning parts 8 while forming the edge-emitting-type LEDA 2 is suited for forming the positioning parts 8. The thicker the layer, the easier it is to fit the positioning parts 8 into the v-shaped grooves 4. However, several micrometers in thickness; may by be enough for an easy fitting.

A detailed description about the components will be given in the following.

The edge-emitting-type LEDA 2 is formed on a p-type GaAs substrate with each device arranged at 250-μm intervals. The number of the light-emitting parts 7 depends on how the optical transmission module 3 is used. For example, in the case where only one channel is used for signal transmission, two light-emitting parts 7 may be provided in order to have one backup channel, thus realizing a reliable transmission system. In the case where the optical transmission module 3 is used for one-byte parallel data transmission for computer interfaces such as SCSI (small computer system interface), 9 channels are provided for a transmission purpose (8 channels for data, 1 channel for a parity bit), and one channel is provided as a backup. Other than light-emitting diodes (LED), laser diodes (LD) or photo diodes (PD) can be used for the edge-emitting-type LEDA 2. Light-emitting diodes have an advantage over other diodes in the amount of electric power to be consumed, and are used for this embodiment of the present invention. For the optical fibers 5, multi-mode fibers of the GI (grade index) type are used which have a core diameter of 50 μm and a clad diameter of 125 μm. If semiconductor lasers are used for the edge-emitting-type LEDA 2, single-mode fibers will be used. In the latter case, however, the alignment of the fibers with regard to emitted light is difficult because of a small core diameter less than 10 μm, so that lenses may become necessary.

Figure 5:
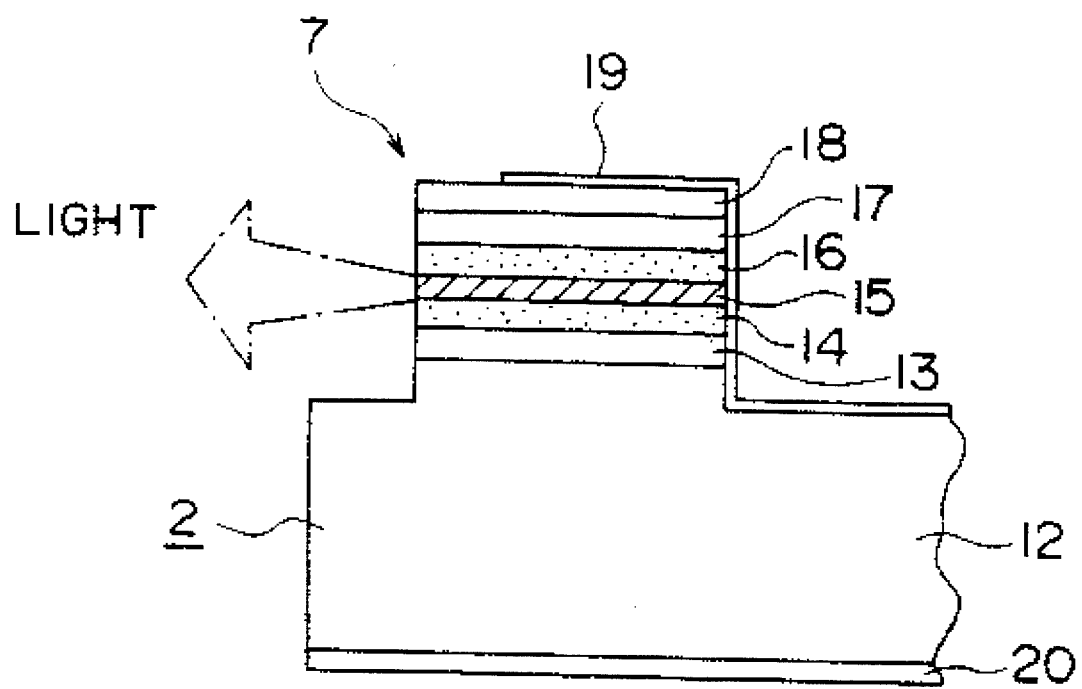
FIG. 5 is a cross-sectional view of an edge-emitting-type LEDA, showing a layer structure of light emitting parts of the edge-emitting-type LEDA.

FIG. 5 shows a layered structure of the edge-emitting-type LEDA 2. On the p-type GaAs substrate 12 are formed a p-type GaAs buffer layer 13, a p-type $Al_{0.4}Ga_{0.6}As$ clad layer 14 having a large band-gap, a $Al_{0.2}Ga_{0.8}As$ active layer 15 serving as a light-emitting layer, an n-type $Al_{0.4}Ga_{0.6}As$ clad layer 16, an n-type GaAs cap layer 17, and a $n^+$-type GaAs contact layer 18 by using the MOVPE method. Such a layered structure as this is called a double hetero-structure.

A plurality of splits (not shown) are formed by a dry-etching method using chlorine from the contact layer 18 on the top to the surface of the substrate 12. These splits make the light-emitting parts 7 electrically separated from each other.

N-side electrodes 19 made of Au-Ge/Ni/Au are formed on the contact layer 18 of the light-emitting parts 7. Also, P-side electrodes 20 made of Au-Zn/Au are formed on a back surface of the substrate 12. Since the edge-emitting-type LEDA 2 having this configuration is formed by the MOVPE method, which is superior at forming a layer with homogeneous characteristics, variations in light emission intensity is contained within ±5% in one chip. Materials used for such a semiconductor device include GaAs, AlGaAs, AlGaInP, InP, InGaAsP, InGaP, InAlP, GaAsP, GaN, InAs, InAsP, InAsSb, etc., as III-VI-family compound semiconductors; ZeSe, ZeS, ZeSSe, CdSe, CdSSe, CdTe, HgCdTe, etc., as II-VI-family compound semiconductors; and PbSe, PbTe, PbSnSe, PbSnTe, etc., as IV-VI-family compound semiconductors. Those materials can be used for the layered structure by utilizing their respective advantageous characteristics. When materials of the AlGaAs type are used for the active layer 15, the composition of GaAs or Al is made greater than 0 and smaller than 0.45. In this case, AlGaAs that has a broader forbidden band than that of the active layer 15 is used for the clad layers 14 and 16.

A second embodiment of an optical transmission module according to the present invention will be described with reference to FIG. 6 to FIG. 8. In the following description, the same parts as those of the first embodiments are referred to by the same numerals, and will not be further described.

In the second embodiment, the positioning parts 8 formed on the edge-emitting-type LEDA 2 have the same layer structure as that of the light-emitting parts 7 also formed on the edge-emitting-type LEDA 2. FIG. 6 shows a configuration in which the positioning parts 8 and the light-emitting parts 7 have the same structure. Namely, the positioning parts 8 have the same layer structure as that of the light-emitting parts 7 shown in FIG. 5.

Such a structure can be made in the process of separating the light-emitting parts 7 from each other. That is, when a dry etching method using chlorine is employed to make splits from the contact layer 18 on the top of the double hetero-structure layer to the surface of the substrate 12, the positioning parts 8 are left remaining in addition to the light-emitting parts 7. This can be done by making an appropriate mask, which is formed on the substrate 12 in the semiconductor process. The positioning parts 8 thus formed have the same structure as the light-emitting parts 7, and the height $h_1$ of the positioning parts 8 becomes the same as the height $h_3$ of the light-emitting parts 7. This height is sufficient enough to fit the positioning parts 8 into the v-shaped grooves 4.

Figure 7A:
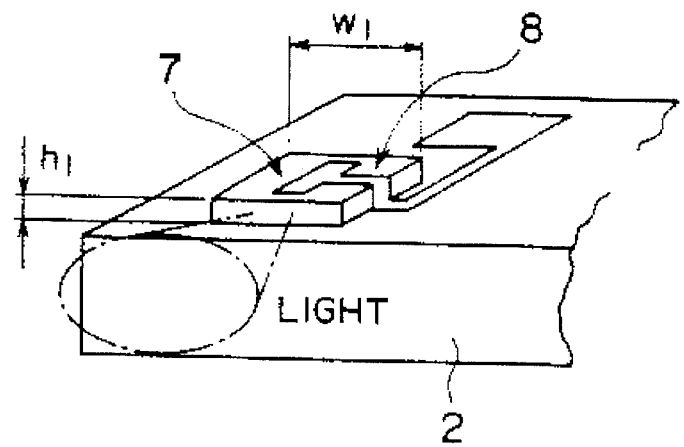
FIGS. 7A, 7B, and 7C are various configurations of light-emitting parts and positioning parts of the edge-emitting-type LEDA of FIG. 6.
Figure 7B:
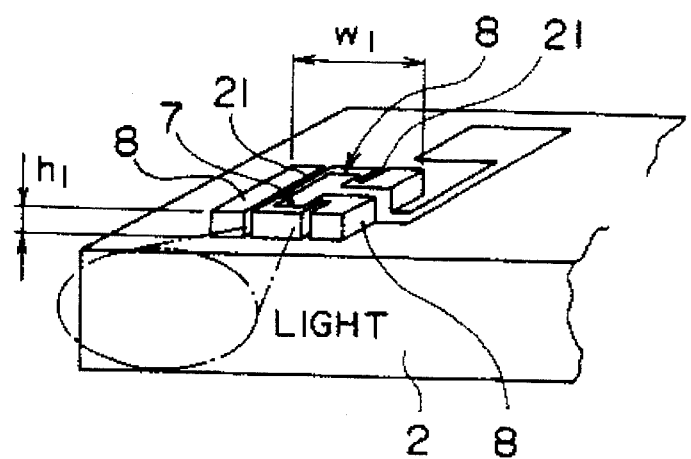
Figure 7C:
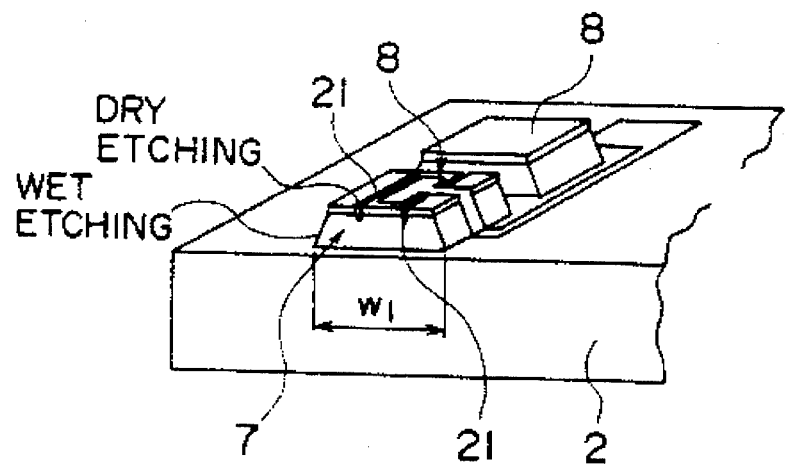

FIGS. 7A to 7C show configurations in which the positioning parts 8 include the light-emitting parts 7 as part thereof, i.e., a single structure has two different functions (a light-emitting function and a positioning function). Here, the width of the positioning parts 8 is made the same as $W_1$ shown in FIG. 1. In FIG. 7B, the positioning part 8 is divided by the splits 21 into parts electrically separated from each other. Such a structure can be formed by applying a semiconductor process for making an electrode after applying the dry-etching method. FIG. 7A shows an example in which the light emitting part 7 and the positioning part 8 are formed as one block. FIG. 7B shows another example in which the light emitting part 7 and the positioning part 8 are formed as one block, and, at the same time, the positioning parts 8 are formed on both sides of that block. In this manner, emission light which has a more efficient light beam pattern can be obtained. In FIG. 7C, a configuration is shown in which the light emitting part 7 and the positioning part 8 are formed as one block with other positioning parts 8 being formed on three sides of that block.

Also, in FIG. 7C, the surface of the substrate of edge-emitting-type LEDA 2 is etched by an wet-etching method, so that the positioning parts 8 end up having a greater height relative to the surface of the substrate. This results in a better configuration for fitting the positioning parts 8 into the v-shaped grooves 4.

FIG. 8 shows data 22 of a light coupling efficiency for each channel of the light transmission module, which uses a GI-type multi-mode fiber array as the optical fibers 5 and uses an 8-bit edge-emitting-type LEDA as the edge-emitting-type optical semiconductor device. Here, the light-coupling efficiency is defined by a ratio of an amount of emitted light entering an optical fiber to an amount of emitted light measured at a front of a LED. As can be seen from the data of FIG. 8, there is little variation in the light-coupling efficiency across different channels.

The positioning parts 8 are made in the same layer structure as that of the light-emitting parts 7 as described above, so that the optical transmission module 3 can be created in a simpler process. This leads to the simplification of the manufacturing process and to a lower cost of the module.

A third embodiment of an optical transmission module according to the present invention will be described with reference to FIGS. 9A and 9B and FIGS. 10A and 10B. In the following description, the same parts as those of the first and second embodiments are referred to by the same numerals, and will not be further described.

Figure 10A:
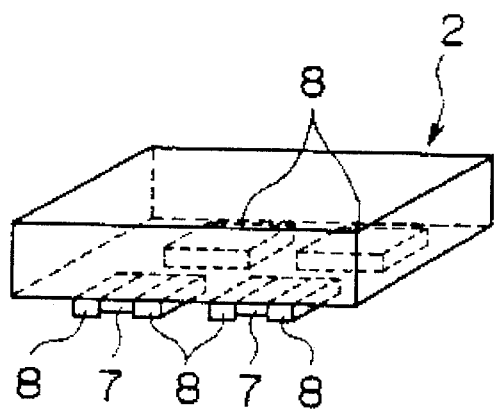
FIGS. 10A and 10B are isometric views of variations of the third embodiment.
Figure 10B:
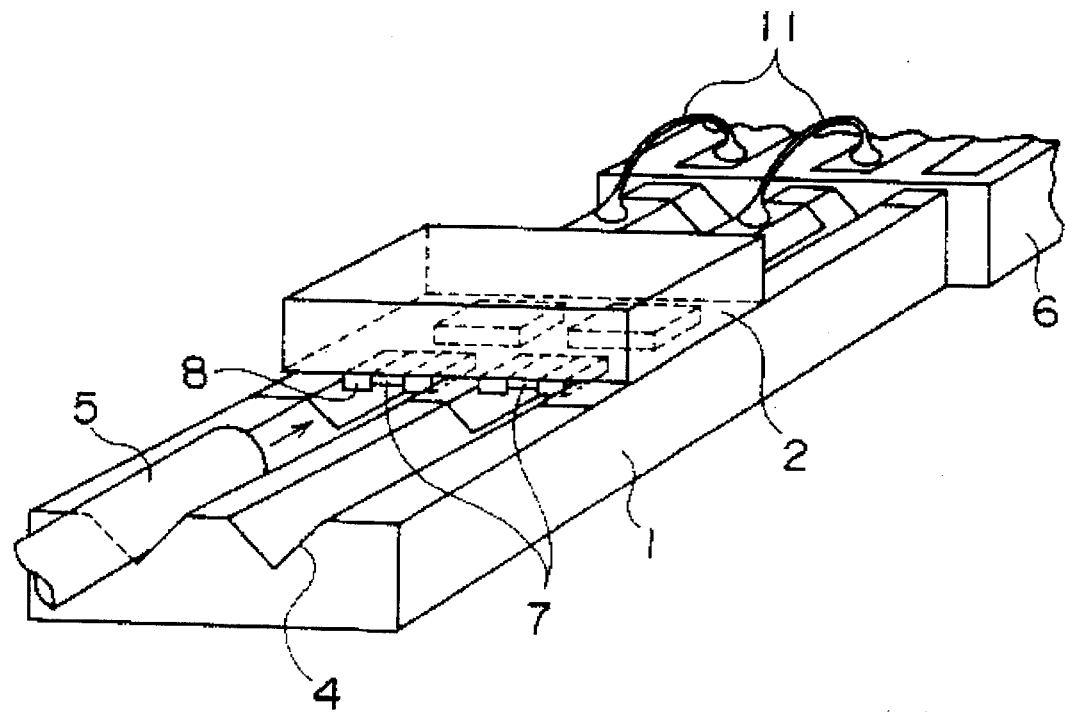

In the third embodiment, the positioning parts 8 formed in the fitting part of the edge-emitting-type LEDA 2 are provided in the proximity of the light-emitting parts 7. In this regard, the third embodiment is the same as the second embodiment shown in FIG. 4B. In the first or the second embodiment, the width $W_1$ of the positioning parts 8 formed on the edge-emitting-type LEDA 2 is made smaller than the width $W_2$ of the v-shaped grooves 4. In the third embodiment, the positioning parts 8 are provided as a protection on sides of the light-emitting parts 7, and the width of the positioning parts 8 and the light emitting part 7 in total is regarded as $W_1$ so as to fit into the v-shaped grooves 4 on the guide substrate 1. In FIGS. 9A and 9B, a basic manner of mounting the edge-emitting-type LEDA 2 on the guide substrate 1 is the same as that of FIG. 1A. In FIGS. 10A and 10B, the same as in FIG. 1A, the edge-emitting-type LEDA 2 is implemented upside down on the guide substrate 1. However, the guide substrate 2 and the sub-substrate 6 are positioned coplanar, and are connected with each other. Thus, the edge-emitting-type LEDA 2 can have a flatter shape. Also, portions of the wire bonding are exposed on the surface. With this configuration, the positioning parts 8 can provide a protection for the light-emitting parts 7. Even if the positioning parts 8 are cracked from the contact with the v-shaped grooves 4 of the guide substrate 1, there is no effect on the light-emitting parts 7. Thus, failures occurring during implementation can be prevented. In this manner, the reliability of the optical transmission module 3 can be enhanced, and, also, an increased yield can lead to a lower cost.

A fourth embodiment of an optical transmission module according to the present invention will be described with reference to FIG. 11 to FIG. 15. In the following description, the same parts as those of the previous embodiments are referred to by the same numerals, and will not be further described.

Figure 11:
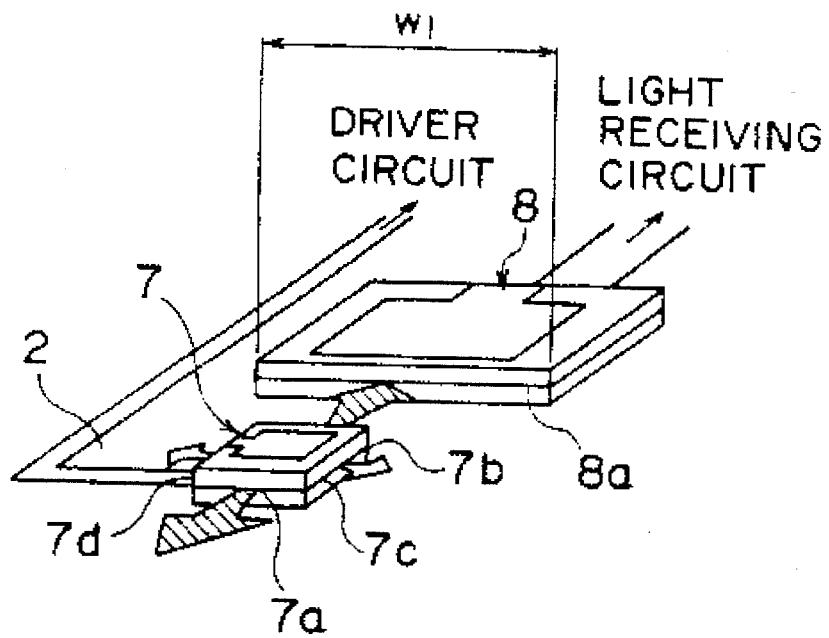
FIG. 11 is an isometric view of a light-emitting part and a positioning part of a fourth embodiment.

In the fourth embodiment, a light-emission-output monitor function for monitoring an output of light emission from the light-emitting parts 7 is provided in the positioning parts 8, which are arranged around the light-emitting parts 7. FIG. 11 shows an example of such a configuration. The edge-emitting-type LEDA 2 which has a double hetero-structure as shown in FIG. 5 generally includes the light-emitting parts 7 comprised of four-layered edge-surfaces, i.e., light-emitting surfaces 7a (front), 7b (back), 7c (right), and 7d (left). In this embodiment, the edge-emitting-type LEDA 2 emits light in two directions, i.e., a direction to the front from the light-emitting surface 7a and a direction to the back from the light-emitting surface 7b. The positioning part 8 is provided behind the edge-emitting-type LEDA 2, having the width $W_1$ and the same structure as that of the edge-emitting-type LEDA 2. The positioning part 8 includes a light-receiving device which has a light-receiving surface 8a for receiving light emitted from the light-emitting surface 7b.

Figure 12:
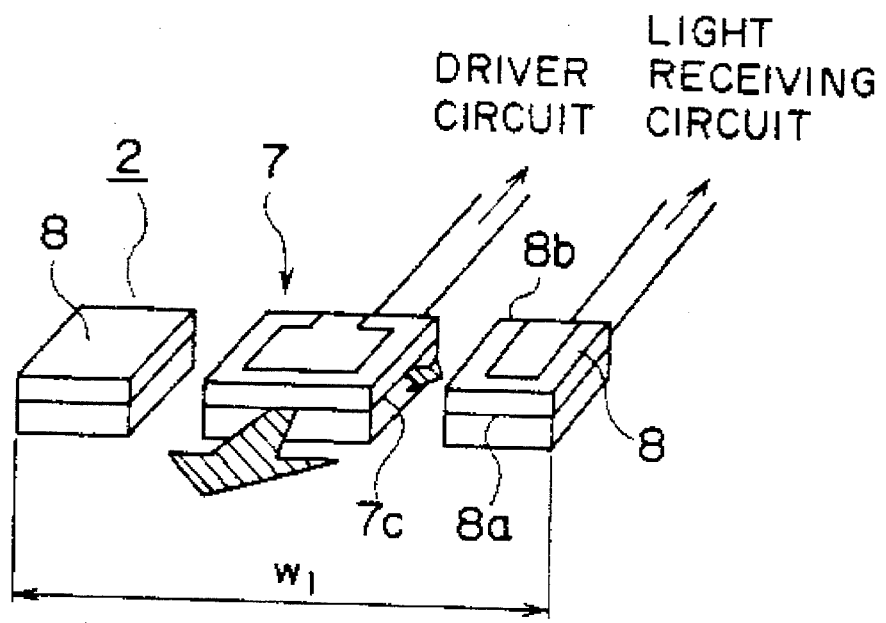
FIG. 12 is an isometric view of another configuration of the light emitting part and the positioning part of the fourth embodiment.

FIG. 12 shows another example of the configuration of the fourth embodiment. In FIG. 12, the width. $W_1$ is a width between outer edges of the positioning parts 8 having the light-emitting part 7 therebetween. One of the positioning parts 8 has a light-receiving surface 8b for receiving light emitted from the light-emitting surface 7c of the light-emitting part 7. This positioning part 8 serves as a light-emission-output monitor function. The other positioning part 8 (on the left in the FIG. 12) does not have a monitor function, and is used only for the positioning purpose. Both positioning parts 8 and the light emitting-part 7 have the same structure as shown in FIG. 5.

Figure 13:
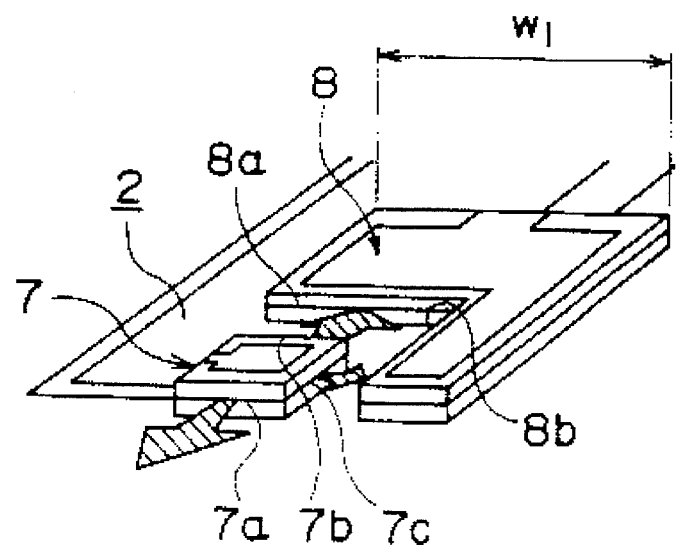
FIG. 13 is an isometric view of yet another configuration of the light-emitting part and the positioning part of the fourth embodiment.

FIG. 13 shows yet another example of a configuration of the fourth embodiment. The configuration of FIG. 13 is a combination of the configurations of FIG. 11 and FIG. 12. Namely, a light receiving-surface 8a of the positioning part 8 receives light emitted from the light-emitting surface 7b of the light-emitting part 7. Also, a light-receiving surface 8b of the positioning part 8 receives light emitted from the light-emitting surface 7c.

Figure 14:
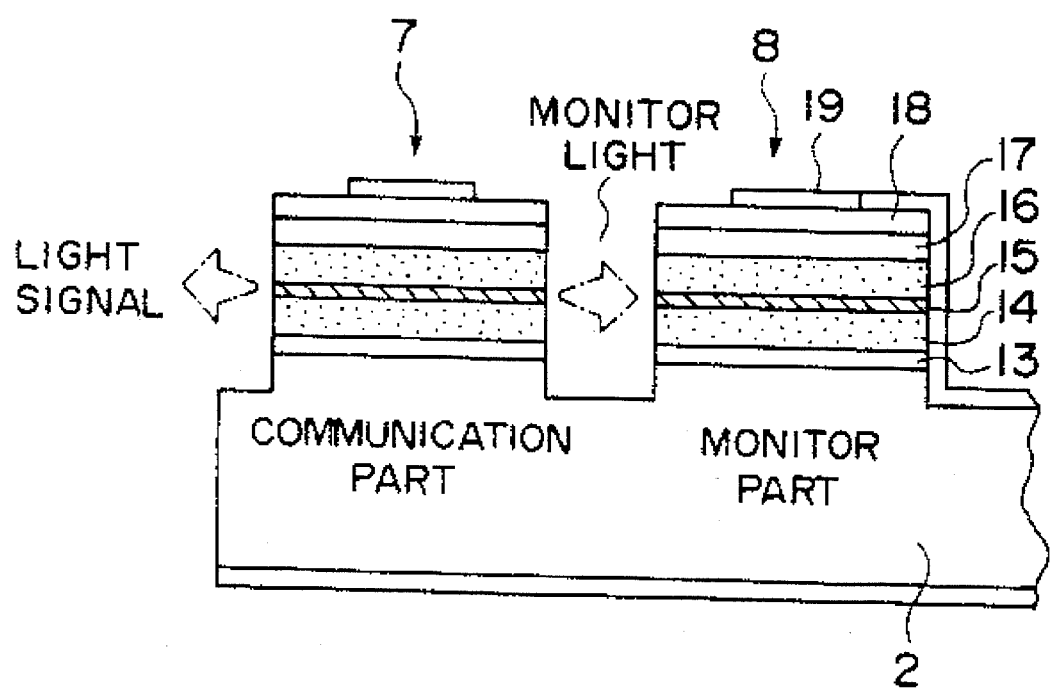
FIG. 14 is a cross-sectional view of an edge-emitting-type LEDA of FIG. 11, showing a layer structure of light-emitting parts thereof.
Figure 15:
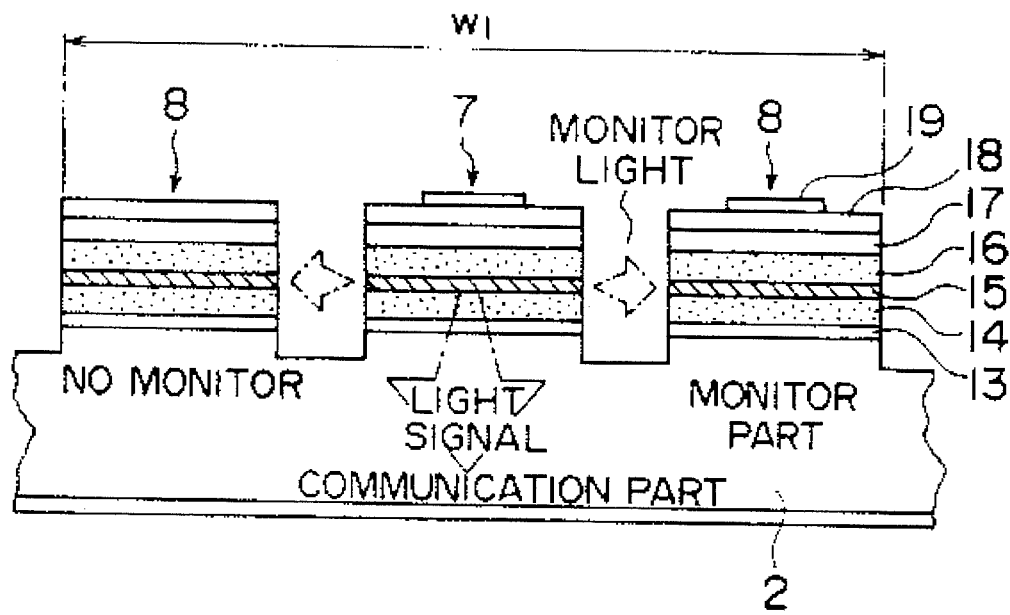
FIG. 15 is a cross-sectional view of an edge-emitting-type LEDA of FIG. 12, showing a layer structure of light-emitting parts thereof.

FIG. 14 shows a side view of the configuration of FIG. 11, and FIG. 15 a side view of the configuration of FIG. 12. The positioning part 8 receives light emitted from the light-emitting part 7 so as to produce a monitor signal indicative of the intensity of the light which is emitted from the light-emitting surface 7a for a transmission purpose. This monitor signal can be obtained by applying a predetermined level of a reversed voltage between the n-side electrode 19 and the p-side electrode 20. The monitor signal thus obtained varies according to the intensity of light which is emitted from the light-emitting surface 7a. Thus, a feedback control can be made with regard to a driver circuit of the light-emitting part 7 such that a difference between the monitor signal and a predetermined reference value is made as small as possible. That is, the output of the light emission can be kept constant at a predetermined value by controlling a pulse width, the number of pulses, and the amount of electric current supplied to the light-emitting part 7. This can counter a change in time of the characteristics of the light-emitting parts 7, thus realizing a reliable data transmission.

Figure 16:
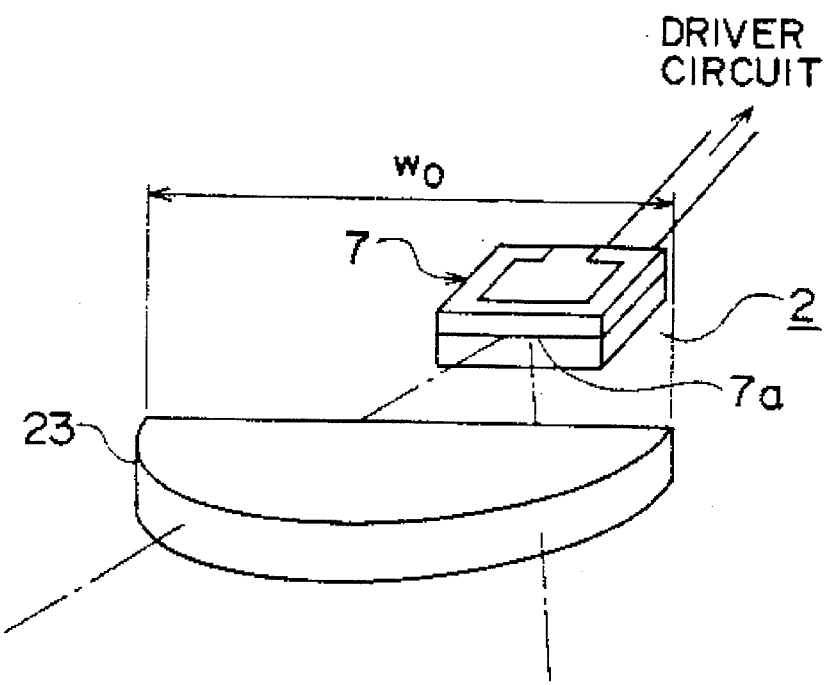
FIG. 16 is an isometric view of a light emitting ]part and a lens of a fifth embodiment.

A fifth embodiment of an optical transmission module according to the present invention will be described with reference to FIG. 16. In the following description, the same parts as those of the previous embodiments are referred to by the same numerals, and will not be further described.

In the fifth embodiment of the present invention, a micro-lens 23 of a thin-layer lens is provided, which has a lens width Wo along the direction X smaller than the width $W_2$ of the v-shaped grooves 4 of the guide substrate 1. The micro-lens 23 has a function of boosting the light coupling efficiency by converging emitted light. With this configuration, the micro-lens 23 itself can serve as a positioning part 8 for fitting into the v-shape grooves 4. The micro-lens 23 can be formed together by forming the edge-emitting-type LEDA (to be described); forming a silicon dioxide layer or a silicon nitride layer on the substrate at a front of the light-emitting surface 7a; and dry-etching the layer so as to leave a lens having the width Wo smaller than the width $W_2$ of the v-shaped grooves 4. In this case, forming the micro-lens 23 and the light-emitting part 7 together further simplifies the forming process.

Figure 17:
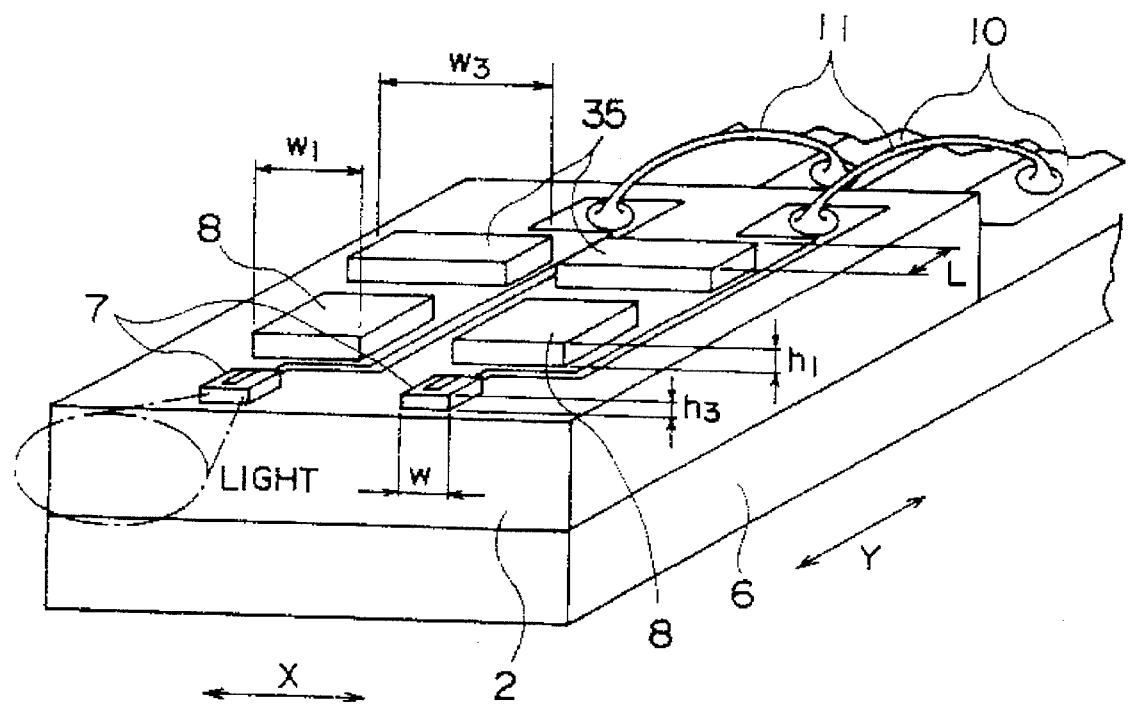
FIG. 17 is an isometric view of an edge-emitting-type LEDA of a sixth embodiment.
Figure 18A:
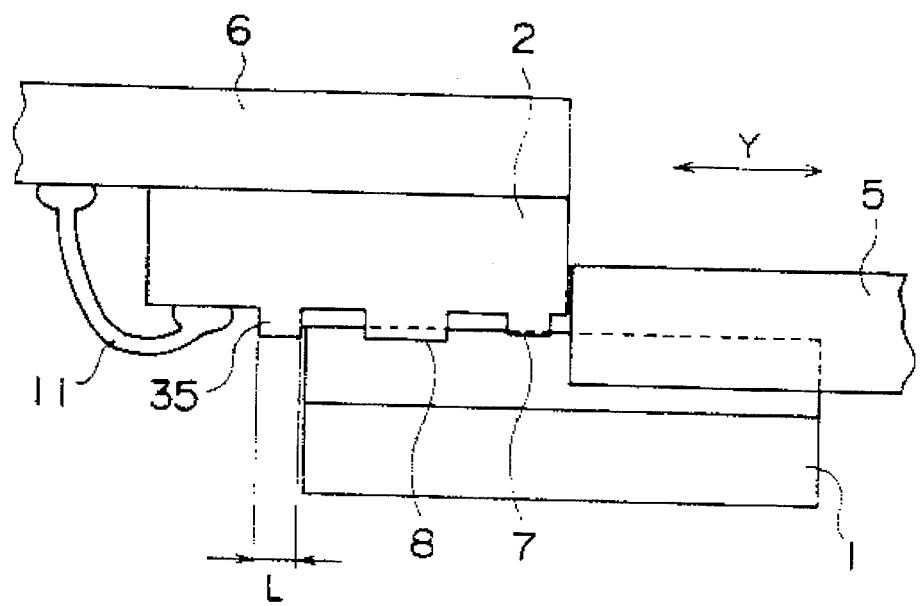
FIGS. 18A and 18B are, respectively, a side view and a cross-sectional view of an optical transmission module of the sixth embodiment.
Figure 18B:
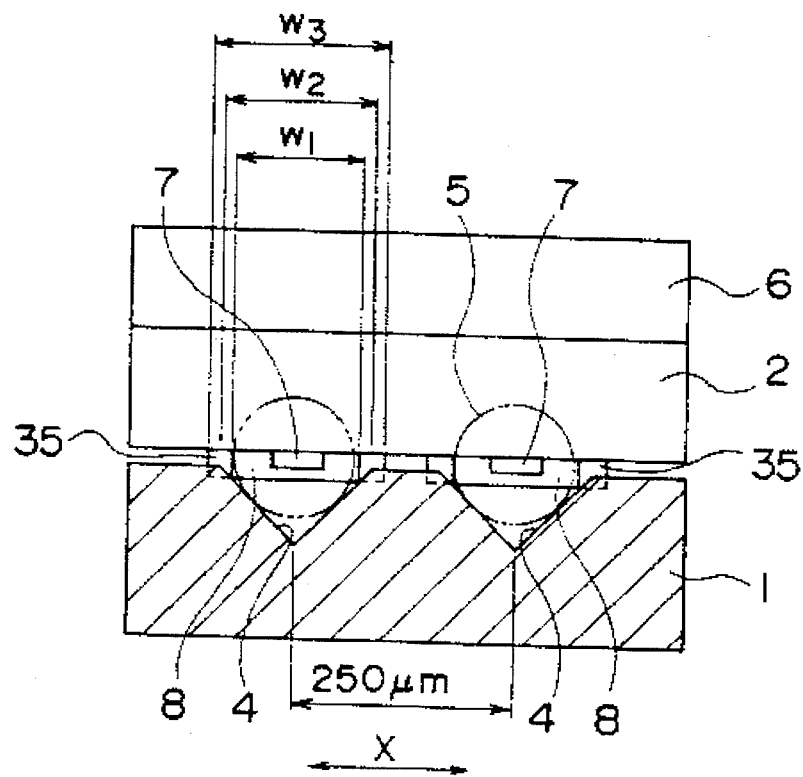

A sixth embodiment of an optical transmission module according to the present invention will be described with reference to FIG. 17 and FIGS. 18A and 18B. In the following description, the same parts as those of the previous embodiments are referred to by the same numerals, and will not be further described.

In the sixth embodiment, at least one positioning part 35 (two in this figure) is provided for positioning the edge-emitting-type LEDA 2 with regard to the guide substrate 1 in a direction Y. Here, the direction Y is perpendicular to the direction X and parallel to a direction in which the optical fibers 5 are extended. The positioning parts 35 are placed in the fitting areas on the edge-emitting-type LEDA 2.

The positioning parts 35 for positioning in the direction Y can be formed with a similar material and in a similar process to those of the positioning parts 8, which are also provided in the same fitting areas. As an example of a size of the positioning parts 35, a length L in the direction Y is 20 μm, and a width $W_3$ in the direction X is larger that the width $W_2$ of the V-shaped grooves 4. Other parameters, i.e., the width $W_1$ and the height $h_1$ of the positioning parts 8, the width $W_2$ and the height $h_2$ of the v-shaped grooves 4, and the width W and the height $h_3$ of the light-emitting parts 7 are all the same as those of the first embodiment shown in FIG. 2 and FIG. 3. Accordingly, as shown in FIGS. 18A and 18B, the edge-emitting-type LEDA 2 can be implemented on the guide substrate 1 without the wires 11 and so fourth making a contact with the guide substrate 1. In this manner, mounting the edge-emitting-type LEDA 2 on the guide substrate 1 can be made more reliably, which leads to a light coupling with a high efficiency and little variation.

Figure 19:
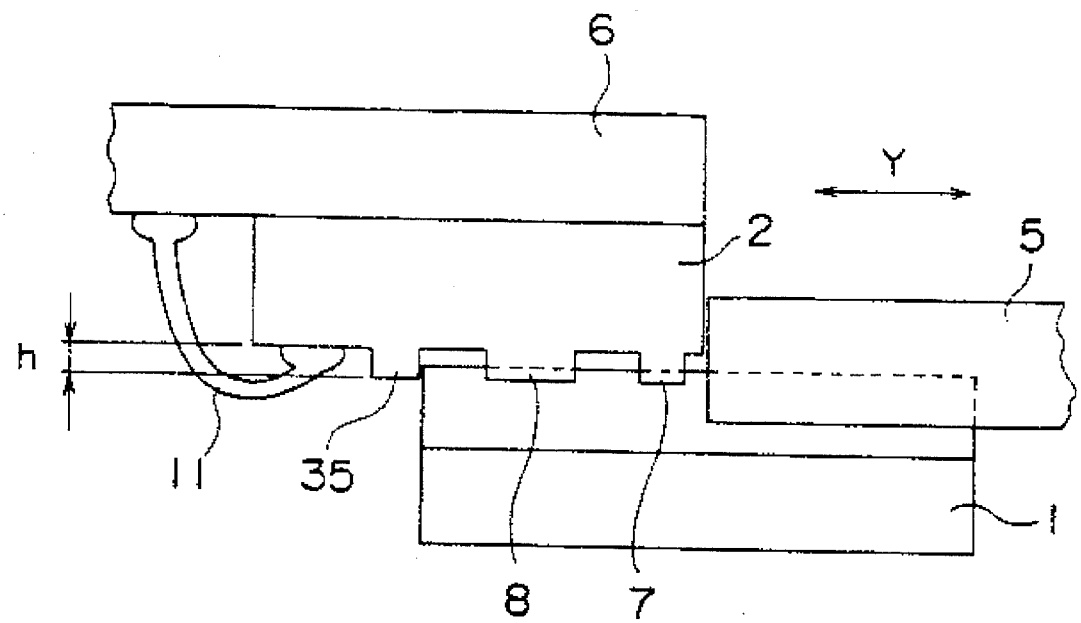
FIG. 19 is a cross-sectional view of an optical transmission module of a seventh embodiment.

A seventh embodiment of an optical transmission module according to the present invention will be described with reference to FIG. 19. In the following description, the same parts as those of the previous embodiments are referred to by the same numerals, and will not be further described.

In this embodiment, the positioning parts 35 differ from the positioning parts 35 of the sixth embodiment only in the fact that it has the same layer structure as that of the light-emitting part 7.

The positioning parts 35 having the same layer structure as that of the light-emitting part 7 can be formed in a similar process to that of the second embodiment, in which the positioning parts 8 are made in the same structure as that of the light-emitting part 7. FIG. 19 shows the edge-emitting-type LEDA 2 implemented upside down on the guide substrate 1. Because of the same structure, the height h of the positioning parts 35 can be made the same as that of the light-emitting parts 7 as well as that of the positioning parts 8. Thus, the implementation of the edge-emitting-type LEDA 2 on the guide substrate 1 can be made precisely without creating variations between different module chips. Also, since the positioning parts 35 can be formed in the same process as that of the light-emitting parts 7, the manufacturing process can be simplified so as to decrease a manufacturing cost.

An eighth embodiment of an optical transmission module according to the present invention will be described with reference to FIGS. 20A and 20B to FIGS. 22A and 22B. In the following description, the same parts as those of the previous embodiments are referred to by the same numerals, and will not be further described.

In the eighth embodiment of the present invention, positioning parts 36 are provided for alignment in the direction Y in at least one (two in the figures) of the fitting areas, where the light-emitting parts 7 are arranged on the edge-emitting-type LEDA 2. The positioning parts 36 have a first portion A whose width is smaller than the width $W_2$ of the v-shaped grooves 4, and a second portion B whose width is larger than the width $W_2$. Also, the positioning parts 36 have a tapered shape gradually changing its width along the direction Y. Here, the direction Y is a direction in which light for transmission is emitted.

Figure 20A:
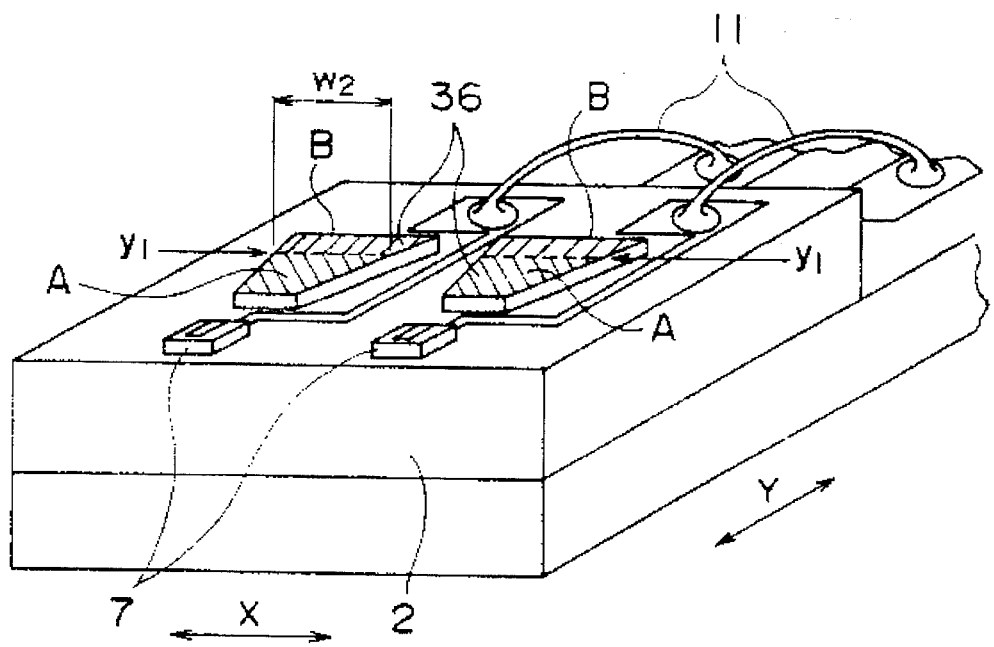
FIGS. 20A and 20B are, respectively, a plan view and a cross-sectional view of an edge-emitting-type LEDA of an eighth embodiment.
Figure 20B:
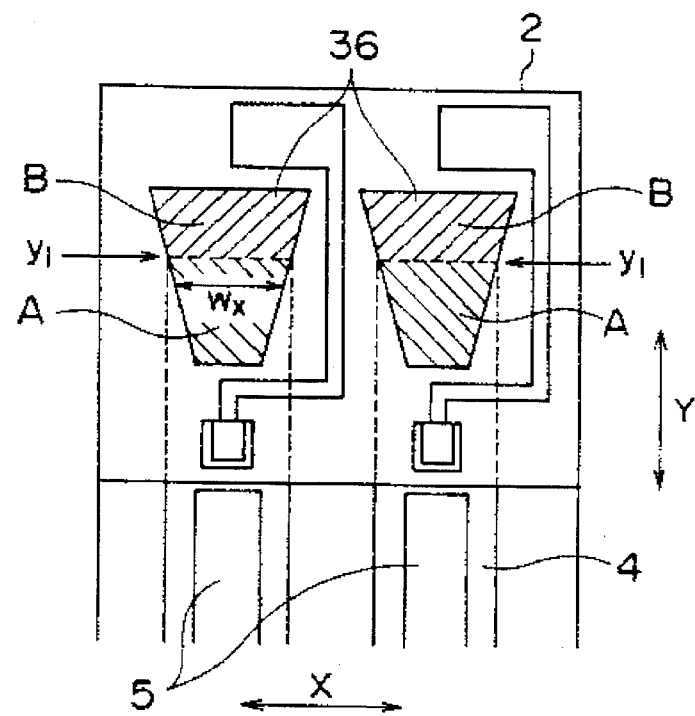

FIGS. 20A and 20B show a configuration in which the positioning parts 36 having a tapered shape are arranged in the fitting areas. The first portion A is the side of the positioning parts 36 nearest to the light-emitting parts 7. The second portion B is the side of the positioning parts 36 nearest to the wire-bonding areas holding the wires 11. As shown in the figures, the positioning parts 36 are tapered along in the direction Y. At a position $Y_1$ in the direction Y, a boundary line is drawn between the first portion A and the second portion B. A width $W_x$ in the direction X of the positioning parts 36 at the position $Y_1$ is the same as the width $W_2$ of the v-shaped grooves 4 of the guide substrate 1.

Figure 21:
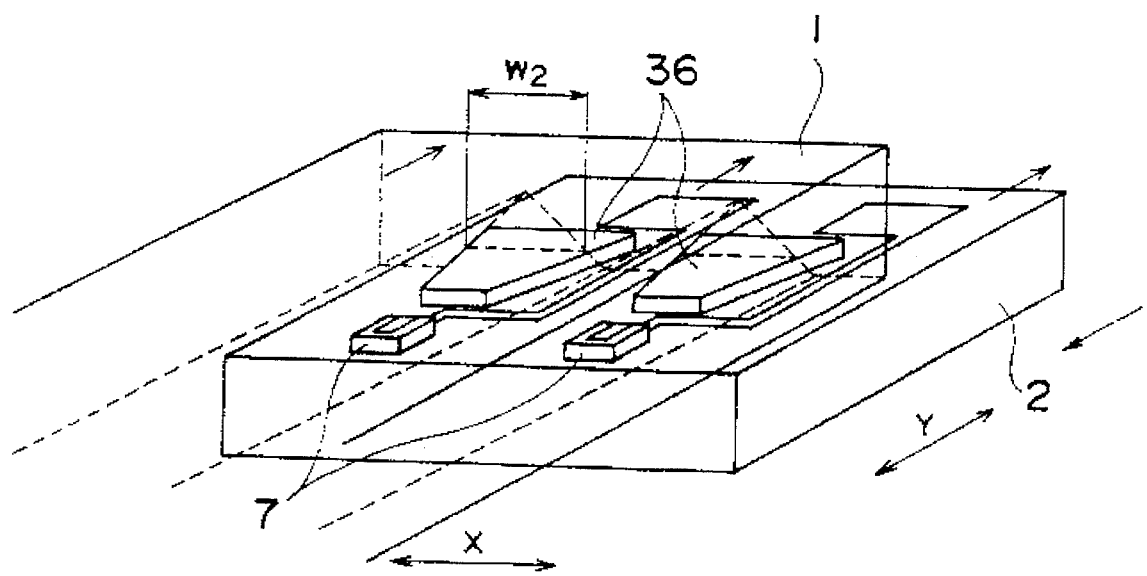
FIG. 21 is an isometric view of the edge-emitting-type LEDA of FIG. 20A attached to a guide substrate.

With this configuration, the light-emitting parts 7 of the edge-emitting-type LEDA 2 are fitted into the v-shaped grooves 4 of the guide substrate 1 by gradually inserting the positioning parts 36 into the v-shaped grooves 4 from the side of the first portion A. When the position $Y_1$ comes in contact with the v-shaped grooves 4, the insertion is completed as shown in FIG. 21. The fact that the position $Y_1$ comes in contact with the v-shaped grooves 4 indicates that the alignment in the direction X and the alignment in the direction Y are completed simultaneously. In this positioning, there is no risk that the wires 11 and so forth make a physical contact with the substrate, which leads to an enhanced reliability of the implementation. Also, the positioning parts 36 can be formed by utilizing a masking technique of semiconductor processes. Thus, the position $Y_1$ can be arranged at a predetermined location, so that the distance between the light-emitting parts 7 and the end of the optical fibers 5 can be precisely determined. Since the positioning described above is a simple process, the manufacturing process can be simplified. The positioning parts 36 may be made in the same layer structure as that of the light-emitting parts 7, as in the second and seventh embodiments. The same layer structure can be formed in a simple process, only requiring a change in masks.

Figure 22A:
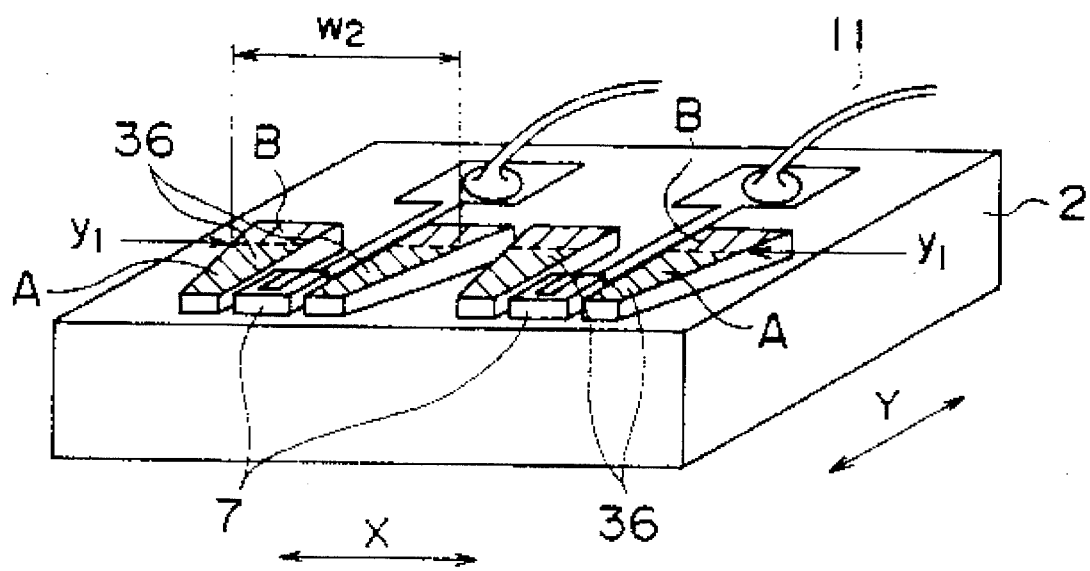
FIGS. 22A and 22B are isometric views showing variations of tapered positioning parts of FIG. 20A.
Figure 22B:
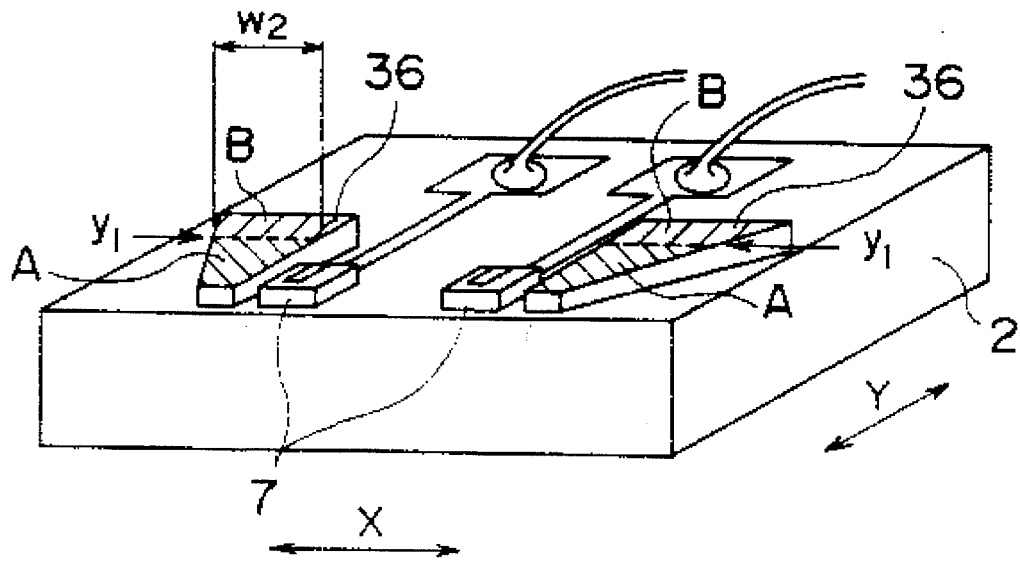

FIGS. 22A and 22B show a configuration in which the positioning parts 36 with a tapered shape are arranged at different locations. In FIG. 22A, the positioning parts 36 are provided on both sides of the light-emitting parts 7. In FIG. 22B, the positioning parts 36 are provided on two sides of the edge-emitting-type LEDA 2. In both cases, the position $Y_1$ in the direction Y is a stopping position when the edge-emitting-type LEDA 2 is mounted on the guide substrate 1. With these configurations, the alignment of the edge-emitting-type LEDA 2 relative to the guide substrate 1 can be simultaneously and precisely carried out with regard to the directions X and Y.

A ninth embodiment of an optical transmission module according to the present invention will be described with reference to FIGS. 23A to 23D. In the following description, the same parts as those of the previous embodiments are referred to by the same numerals, and will not be further described.

In this embodiment, a method for a simple implementation of the edge-emitting-type LEDA 2 on the guide substrate 1 is proposed. This method is effective in a situation where the edge-emitting-type LEDA 2 is implemented upside down in order to prevent the wires 11 from interfering with the implementation process. FIGS. 23A to 23D show each step of the method, which will be described below.

Figure 23A:
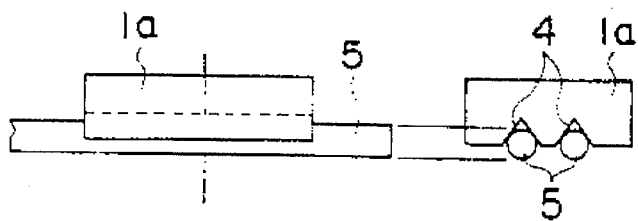
Figure 23C:
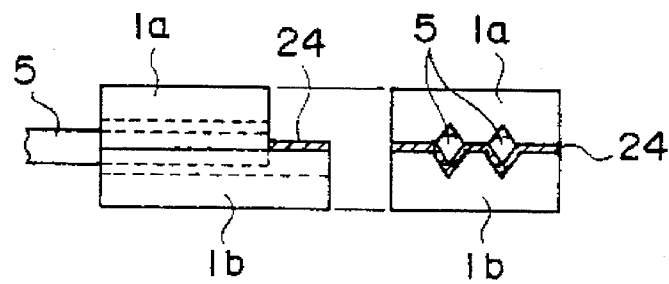
Figure 23D:
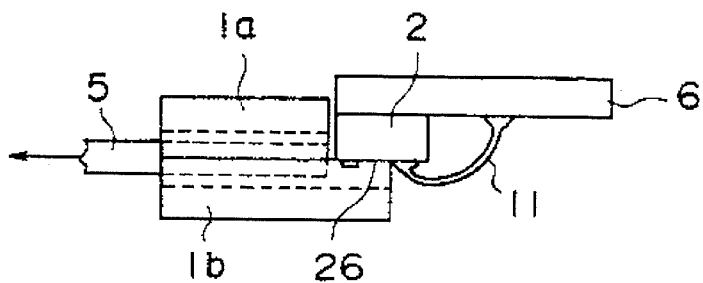

At an optical fiber arranging step shown in FIG. 23A and FIG. 23B1, the optical fibers 5 are fixed in the v-shaped grooves 4 in a first guide substrate 1a, and the optical fibers 5 are cut along with the first guide substrate 1a. In cutting the optical fibers 5, a process with a high accuracy using a discharging dresser or a cutting process using a ultra-thin SiC blade may be used so as to ensure clean edges of the optical fibers. Even if the cross-sections are not clean and accurate enough, an ordinary grinding process can be applied on the cross-sections in order to achieve a desired accuracy. Then, as shown in FIG. 23B2, a second guide substrate 1b, which has an identical v-shaped-groove pattern as that of the first guide substrate 1a, is provided with a cover 24 which is a resist pattern overlaying the areas for mounting the edge-emitting-type LEDA 2. Here, the cover 24 can be readily formed on the second guide substrate 1b, which is made of Si, through a photo lithography technique employing a photoresist used in a semiconductor process and the like. Then, at an optical fiber fixing step shown in FIG. 23C, the first guide substrate 1a with the optical fibers 5 attached thereto is adhered to the second guide substrate 1b, such that the optical fibers 5 are placed between the first and second guide substrates 1a and 1b. In doing so, the edges of the optical fibers 5 are made to come in contact with an edge of the cover 24. Since the cover 24 is made of a photoresist, the cover 24 does not pose any damage on the optical fibers 5. Thus, the optical fibers 5 with the aligned edges can be fixed while being positioned by the edge of the cover. Then, at a cover removal step, the cover 24 is removed to reveal the entire cross-sections of the aligned optical fibers 5 and the areas (hereinafter called a wiring connection area 26) to which the edge-emitting-type LEDA 2 is to be implemented. Finally, at an optical-device implementing step shown in FIG. 23D, the edge-emitting-type LEDA 2 along with the sub-substrate 6 is implemented upside down on the wiring connection area 26 so as to face the optical fibers 5. In doing so, the positioning is ultimately controlled by the positioning parts 8 of the edge-emitting-type LEDA 2 and the v.-shaped grooves 4 of the guide substrate 1b. As described above, the wiring connection area 26 created on the guide substrate 1b in advance can help to establish light couplings. Also, the manufacturing process clan be simplified. Although this embodiment has not been described with regard to the positioning parts 35 or 36, the implementation of the edge-emitting-type LEDA 2 with the positioning parts 35 or 36 is the same as those of the previous embodiments. With the positioning parts 35 or 36, this embodiment can readily realize an alignment in the directions X and Y, and light couplings with a high efficiency and little variations.

A tenth embodiment of an optical transmission module according to the present invention will be described with reference to FIGS. 24A and 24B through FIGS. 26A to 26C. In the following description, the same parts as those of the previous embodiments are referred to by the same numerals, and will not be further described.

Figure 24A:
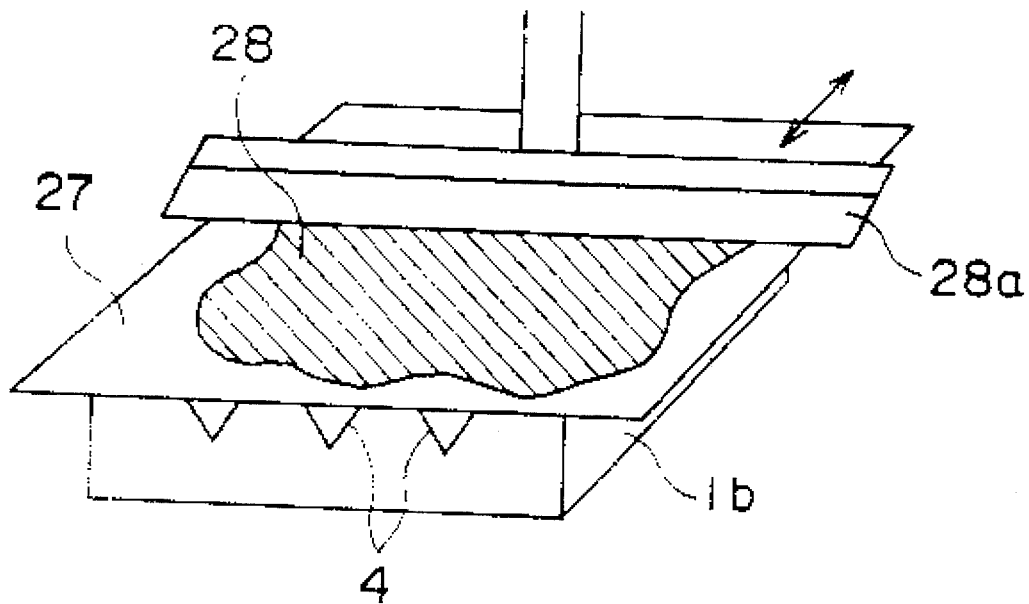
FIGS. 24A and 24B are isometric views for explaining a method of forming an optical transmission module, according to a tenth embodiment of the present invention.
Figure 24B:
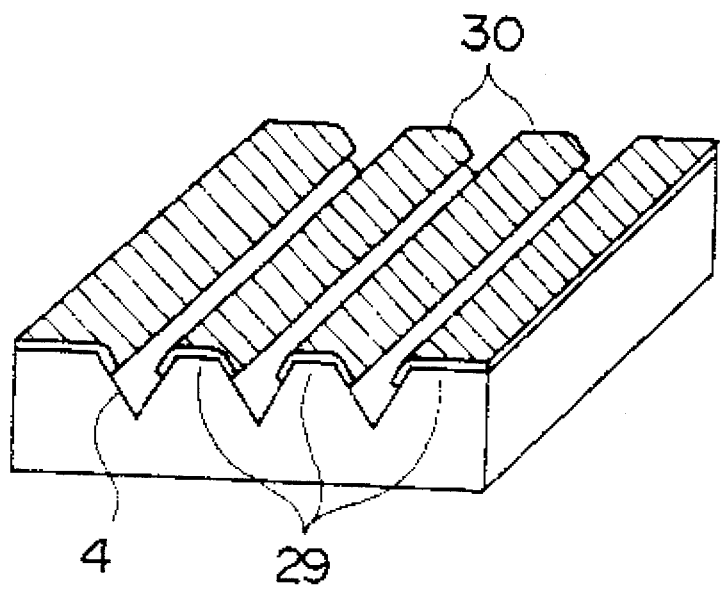

The tenth embodiment is concerned with a method of forming the optical transmission module of the ninth embodiment of the present invention. Here, a method will be described of forming a conductive layer on the guide substrate 1b, which is necessary for establishing electrical contact with the edge-emitting-type LEDA 2. First, at an insulator-layer forming step, an insulator layer (not shown) is formed on the surface of the guide substrate 1b which is made of Si. (The insulator-layer forming step may be omitted in some cases.) The insulator layer can be formed on the surface of the substrate, for example, by forming an oxide layer $SiO_2$ by heat in an ordinary furnace or by forming a nitride layer SION, $Si_3N_4$, etc. At a printing step, a Au paste 28 (conductive paste material) is pasted through a screen mask 27 on the guide substrate 1b by using a squeegee 28a, as shown in FIG. 24A, in an ordinary screen printing method. As shown in FIG. 24B, conductive layers 30 are formed on ridges 29 of the surface. The conductive layers 30 are connected to a driver circuit or a light receiving circuit. Those circuits may be integrally formed as hybrid circuits on the guide substrate 1b in advance, or may be formed on a separate substrate so as to be later connected with the conductive layers 30. Printing conditions are shown in the following.

Gold Paste: TR1301 (made by Tanaka Precious Metal International)

Mask: 325 mesh stainless screen

Drying: 10±5 minute leveling at room temperature >15±5 minute drying at 120±5 degrees Celsius Baking: 60±3 minutes from an entrance to an exit with the peak temperature of 850±1 degrees Celsius lasting for 10±1 minutes The printing conditions cited above depend on a printing device. However, general requirements are that a speed of the process is slow, a printing pressure is small, and a gap between printing materials is large. The screen mask 27 used in this process is one which permits the paste to pass through all the area. After printing on the ridges 29 of the guide substrate 1b, the edge-emitting-type LEDA 2 is implemented upside down. In the implementation of the edge-emitting-type LEDA 2, the flip-chip method using conductive polymer bumps is used instead of using traditional solder bumps. A step of using the conductive polymer bumps will be described below.

At a dielectric-polymer-protective-layer forming step, a dielectric polymer protective layer, which is made of polyimide, is printed on the chip, except on pads, by using a screen printing technique. This dielectric polymer protective layer serves as a protective layer and, also, as a barrier for a bump layer to be subsequently formed.

At a conductive-polymer-bump-layer forming step, a conductive polymer bump layer is formed on the pads of the chip by using a screen printing technique. Then, the conductive polymer bump layer is hardened by IR (infrared ray) curing.

At a flip-chip connecting step, the chip and the substrate are connected together. Although this type of connection does not show a self-alignment characteristic, alignment does not become a problem since this embodiment uses the positioning parts and the v-shaped grooves for the alignment. A sturdy connection can be obtained by solidification at 150 degrees Celsius for 10 minutes on a platform heated by an alignment/bonder device for flip chips. Here, for the dielectric polymer protective layer and the conductive polymer bump layer, products made by the Epoxy Technology cooperation are used in this embodiment.

Figure 25A:
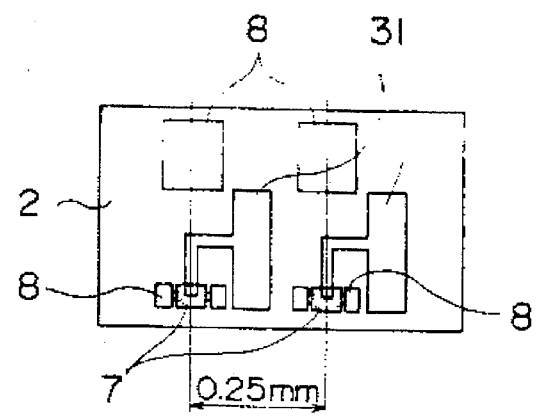
FIGS. 25A and 25B are, respectively, a plan view of an edge-emitting-type LEDA on which pads are created, and a plan view of the edge-emitting-type LEDA attached on a guide substrate on which a conductive polymer bump layer is formed.
Figure 25B:
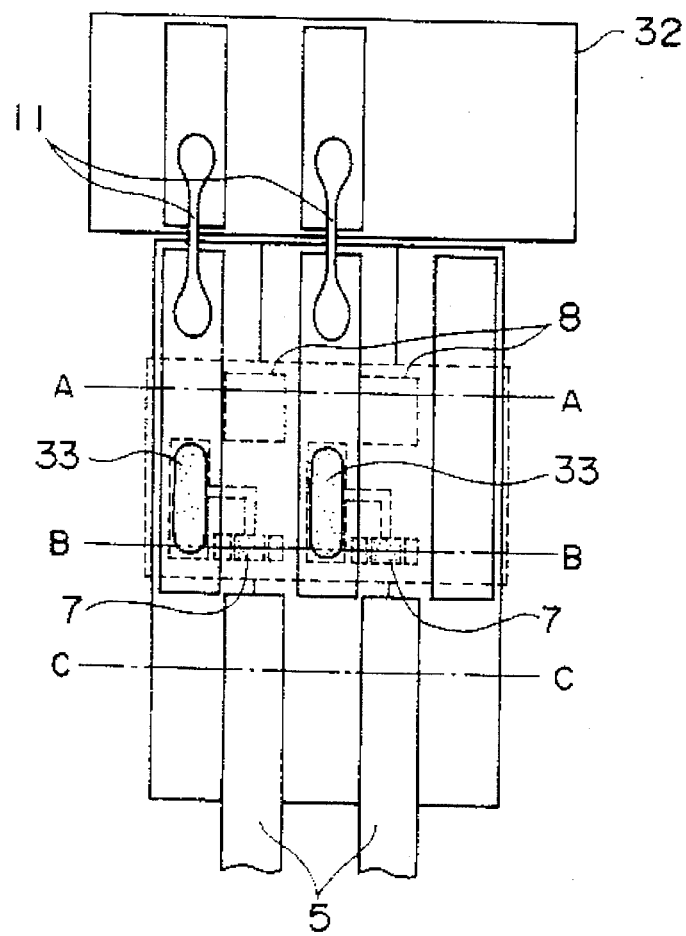
Figure 26A:
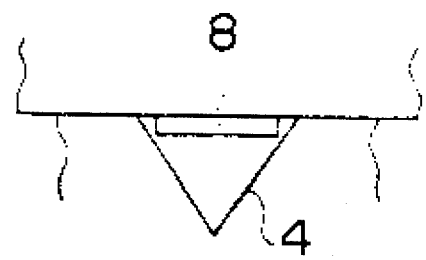
FIGS. 26A, 26B, and 26C are cross-sectional views of the edge-emitting-type LEDA and the guide substrate of FIG. 25B taken along lines A-A, B-B, and C-C, respectively.
Figure 26B:
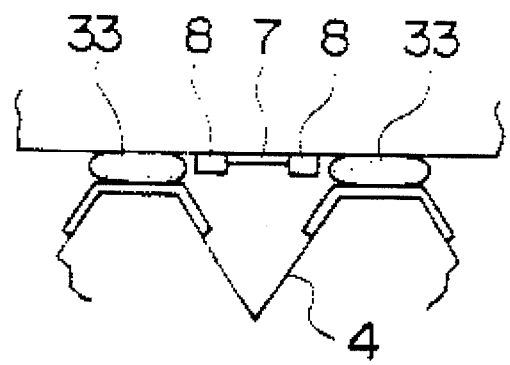
Figure 26C:
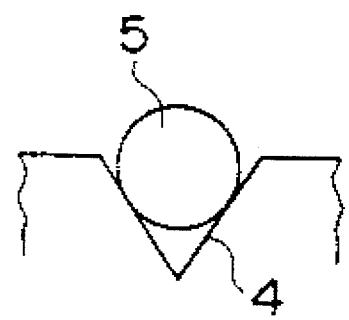

Implementation as described above can simplify the manufacturing process, and does not need solder, flux, or any cleaning treatment. Also, the use of no metal at connecting points realizes reliable electrical connections without silver migration or any problem concerning electrical insulation between pads. FIG. 25A shows a plan view of the edge-emitting-type LEDA 2 which has the light-emitting parts 7 for two channels connected with pads 31. FIG. 25B shows a configuration in which the edge-emitting-type LEDA 2 is mounted on the guide substrate 1b, which is connected with an external driver circuit 32 and has conductive polymer bump layers 33 formed thereon for providing wiring connection areas. FIGS. 26A, 26B, and 26C are cross-sectional views taken along lines A—A, B—B, and C—C of FIG. 25B, respectively. As shown in those figures, the edge-emitting-type LEDA 2 and the guide substrate 1b with the driver circuit 32 attached thereto are connected together such that the pads 31 are connected with the conductive polymer bump layers 33. Also, as described above repeatedly, the positioning parts 8 are fitted into the v-shape grooves 4, as shown in FIG. 26A. The optical transmission module thus created ensures reliable signal transmission. Also, the manufacturing process can be simplified, and can be carried out at a lower cost.

According to the first embodiment of the present invention, the positioning parts are provided on the fitting areas of the edge-emitting-type LEDA where the light-emitting parts or the light-receiving parts are arranged. The width of the positioning parts is smaller than that of the v-shaped grooves formed on the guide substrate for holding the optical fibers. Thus, fitting the positioning parts into the v-shaped grooves enables an easy and accurate mounting of the edge-emitting-type LEDA on the guide substrate. Also, highly efficient light couplings with little output variations can be realized. Furthermore, this embodiment can simplify the implementation process, yet provides a highly reliable optical transmission module.

According to the second embodiment of the present invention, the positioning parts formed on the fitting areas of the edge-emitting-type LEDA according to the first embodiment has the same layer structure as that of the light emitting (or -receiving) parts on the edge-emitting-type LEDA. Thus, the layer structure of the positioning parts can be formed in the same process as that for forming the light-emitting (or -receiving) parts. This leads to a simplification of the manufacturing process and to a lower cost associated with the manufacturing of the module.

According to the third embodiment of the present invention, the positioning parts of the first or second embodiment are provided around the light-emitting (or -receiving) parts. Thus, the positioning parts surround and protect the light emitting (or receiving) parts, so that cross-talks between channels can be avoided and no possible damages can be inflicted on the light-emitting (or -receiving) parts during the implementation. This leads to reliable optical transmission and to a higher yield resulting in a lower manufacturing cost.

According to the fourth embodiment of the present invention, the positioning parts arranged around the light-emitting parts according to the third embodiment are provided with the light emission output monitor function. This function is used for monitoring the output of the light-emitting parts. Thus, both a monitoring function and a positioning function are provided for the positioning parts. The monitoring function can provide means for detecting a reduction from wear in light emission output or a malfunction of transmission lines, thus enabling a reliable data transmission.

According to the fifth embodiment of the present invention, the thin-layer lenses are provided in front of the light-emitting parts, and have a maximum width smaller than the width of the v-shaped grooves formed on the guide substrate. Thus, the thin-layer lenses can be used for fitting into the v-shape grooves of the guide substrate. This leads to highly efficient light couplings and to a simpler manufacturing process.

According to the sixth embodiment of the present invention, the positioning parts are provided on the fitting area of the edge-emitting-type LEDA in order to align the edge-emitting-type LEDA with the guide substrate in a direction of the light transmission axis. Thus, mounting the edge-emitting-type LEDA on the guide substrate can be made more precisely, which leads to light couplings with a high efficiency and little output variation. Also, the manufacturing process as well as the implementation process can be simplified, providing a more reliable optical transmission module.

According to the seventh embodiment of the present invention, the positioning parts for alignment in the direction of the light transmission axis have the same layer structure as that of the light-emitting (or -receiving) parts. Thus, the positioning parts can be made in the same process as that for forming the light-emitting (or -receiving) parts, so that the manufacturing process can be simplified and that the manufacturing cost can be lowered. Also, since the height of the positioning parts can be made the same as that of the light-emitting (or -receiving) parts, the positioning can be made more accurate.

According to the eighth embodiment of the present invention, the positioning parts with a tapered shape are provided on the fitting area of the edge-emitting-type LEDA. The positioning parts have the first portion whose width is smaller than the width of the v-shaped grooves, and the second portion whose width is larger than the width of the v-shaped grooves. Thus, when the edge-emitting-type LEDA is mounted on the guide substrate, an alignment in the direction of the light transmission axis can be made simultaneously with an alignment in the lateral direction. Also, light coupling can be made highly efficient with little output variation. This leads to a simpler manufacturing process as well as a simpler implementation process, thus providing a more reliable optical transmission module.

According to the method of the ninth embodiment of the present invention, optical fibers are arranged so as to be lined up in the v-shaped grooves of the first guide substrate. Then, the second guide substrate, which has the v-shaped grooves in the same arrangement as that of the first guide substrate, are adhered to the first guide substrate with the optical fibers placed therebetween. Here, there is a cover layer formed beforehand on part of the surface of the second guide substrate, which part is not used for placing the optical fibers between the first and second guide substrates. Then, the cover layer formed on the second guide substrate is removed so as to expose a wiring connection area. Finally, the edge-emitting-type LEDA is implemented on the wiring connection area of the second guide substrate such that the light-emitting (or -receiving) parts face the cross-sections of the optical fibers placed between the first and second guide substrates. Thus, light couplings are established between the optical fibers and the light-emitting (or -receiving) parts. In this manner, the light couplings can be made readily, which leads to a simplified manufacturing process.

According to the tenth embodiment of the present invention, the conductive paste material is pasted by screen printing on the ridges of the second guide substrate which are platform areas between the v-shaped grooves. Then, the conductive paste material is baked so as to provide a wiring pattern on the wiring connection area. Finally, the wiring pads on the edge-emitting-type LEDA are connected to the wiring connection area on the second guide substrate, thus providing electrical connection with external circuits. Thus, the light transmission module can be made in a simple process without using a photomask for a semiconductor process. This leads to a more reliable light signal transmission and to a simpler and lower cost manufacturing process Further, the present invention is not limited to these embodiments, but various variations and modifications may be made without departing from the scope of the present invention.

What is claimed is:

1. An optical transmission module having optical fibers and an optical semiconductor device with light couplings between said optical fibers and conversion parts of said optical semiconductor device, which conversion parts either convert optical signals into electrical signals or convert electrical signals into optical signals, said optical transmission module comprising:

a guide substrate having grooves which hold said optical fibers; and at least one positioning part formed on and protruding from said optical semiconductor device and having a width smaller than that of said grooves, wherein said optical semiconductor device is attached to said guide substrate such that said at least one positioning part fits into said grooves, so that said conversion parts face end surfaces of said optical fibers to establish said light couplings.

2. The optical transmission module as claimed in claim 1, wherein said optical semiconductor device is of an edge-emitting type.

3. The optical transmission module as claimed in claim 1, wherein said grooves are formed generally in parallel in said guide substrate at predetermined intervals.

4. The optical transmission module as claimed in claim 1, wherein said at least one positioning part is located on a side of said conversion parts, whose opposite side to said side faces said optical fibers.

5. The optical transmission module as claimed in claim 1, wherein said at least one positioning part has the same layer structure as that of said conversion parts.

6. The optical transmission module as claimed in claim 1, wherein said at least one positioning part is provided in a close proximity around said conversion parts.

7. The optical transmission module as claimed in claim 6, wherein said at least one positioning part comprises means for monitoring an output of light emitted from said conversion parts, which convert electrical signals into optical signals.

8. The optical transmission module as claimed in claim 1, where said at least one positioning part comprises thin-layer lenses provided between said conversion parts and said optical fibers.

9. The optical transmission module as claimed in claim 1, further comprising another at least one positioning part formed on and protruding from said optical semiconductor device, wherein said another at least one positioning part comes in contact with a side end surface of said substrate so as to determine spacing between said conversion parts and said optical fibers.

10. The optical transmission module as claimed in claim 9, wherein said another at least one positioning part has the same layer structure as that of said conversion parts.

11. An optical transmission module having optical fibers and an optical semiconductor device with light couplings between said optical fibers and conversion parts of said optical semiconductor device, which conversion parts either convert electrical signals into optical signals or convert optical signals into electrical signals, said optical transmission module comprising:

a guide substrate having grooves which hold said optical fibers; and at least one positioning part formed on and protruding from said optical semiconductor device and having a tapered shape with the narrowest end having a width smaller than that of said grooves and the widest end having a width larger than that of said grooves;

wherein said optical semiconductor device is attached to said guide substrate such that said at least one positioning part fits into said grooves, so that said conversion parts face end surfaces of said optical fibers to establish said light couplings.

12. The optical transmission module as claimed in claim 11, wherein said optical semiconductor device is of an edge-emitting type.

13. The optical transmission module as claimed in claim 11, wherein said grooves are formed generally in parallel in said guide substrate at predetermined intervals.

14. A method of forming a light transmission module having optical fibers and an optical semiconductor device with light couplings between said optical fibers and conversion parts of said optical semiconductor device, which conversion parts either convert electrical signals into optical signals or convert optical signals into electrical signals, said method comprising the steps of:

fixing said optical fibers in first grooves formed in a first guide substrate;

forming a cover layer on a first part of a top surface of a second guide substrate which has second grooves in a mirror image arrangement of that of said first grooves;

sticking said first guide substrate to said second guide substrate such that said optical fibers are placed between said first grooves and said second grooves and such that said first guide substrate lies on a second part of said top surface where said cover layer is not provided, wherein said first guide substrate is positioned by an edge of said cover layer;

removing said cover layer from said first part; and attaching said optical semiconductor device to said first part of said top surface, wherein said conversion parts face end surfaces of said optical fibers to establish said light couplings.

15. The method as claimed in claim 14, further comprising the steps of:

pasting a conductive paste material for use as a wiring material on ridges between said second grooves on said second guide substrate by means of a screen printing method;

forming a wiring pattern by baking said conductive paste material; and attaching said optical semiconductor device to said first part of said top surface of said second guide substrate such that wiring pads of said optical semiconductor device are electrically connected to said wiring pattern.

* * * * *

UNITED STATES PATENT AND TRADEMARK OFFICE
CERTIFICATE OF CORRECTION

PATENT NO. : 5,544,269
DATED : August 6, 1996
INVENTOR(S) : Hitoshi HATTORI

It is certified that error appears in the above-indentified patent and that said Letters Patent is hereby corrected as shown below:

Title page, left-hand column, before section [51], please insert the following:

[30]    Foreign Application Priority Data

Dec. 17, 1993    [JP]    Japan .............................. 5-317819
Jul. 5, 1994     [JP]    Japan .............................. 6-153400

Signed and Sealed this

Ninth Day of September, 1997

BRUCE LEHMAN

*Attest:*

*Attesting Officer*          *Commissioner of Patents and Trademarks*